(12) United States Patent
Wang et al.

(10) Patent No.: US 10,879,075 B2
(45) Date of Patent: Dec. 29, 2020

(54) WRAP-AROUND CONTACT PLUG AND METHOD MANUFACTURING SAME

(71) Applicant: Taiwan Semiconductor Manufacturing Company, Ltd., Hsinchu (TW)

(72) Inventors: Sung-Li Wang, Zhubei (TW); Jyh-Cherng Sheu, Hsinchu (TW); Huang-Yi Huang, Hsinchu (TW); Chih-Wei Chang, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/859,125

(22) Filed: Apr. 27, 2020

(65) Prior Publication Data
US 2020/0258746 A1    Aug. 13, 2020

Related U.S. Application Data

(60) Continuation of application No. 16/599,773, filed on Oct. 11, 2019, now Pat. No. 10,636,664, which is a
(Continued)

(51) Int. Cl.
*H01L 21/285* (2006.01)
*H01L 21/321* (2006.01)
(Continued)

(52) U.S. Cl.
CPC .. *H01L 21/28518* (2013.01); *H01L 21/02186* (2013.01); *H01L 21/02247* (2013.01);
(Continued)

(58) Field of Classification Search
CPC ......... H01L 21/28518; H01L 21/02186; H01L 21/02247
See application file for complete search history.

(56) References Cited

U.S. PATENT DOCUMENTS

| 5,545,592 A | 8/1996 | Iacoponi |
| 5,856,237 A | 1/1999 | Ku |

(Continued)

FOREIGN PATENT DOCUMENTS

| KR | 20000000869 A | 1/2000 |
| KR | 100538806 B1 | 12/2005 |

(Continued)

OTHER PUBLICATIONS

Epivalence, "High Purity Solid Metal Halide Materials," http://epivalence.com/products-services/high-purity-halides/, Jul. 19, 2019, 2 pages.
(Continued)

*Primary Examiner* — Errol V Fernandes
(74) *Attorney, Agent, or Firm* — Slater Matsil, LLP

(57) ABSTRACT

A method includes forming a source/drain region, and in a vacuum chamber or a vacuum cluster system, preforming a selective deposition to form a metal silicide layer on the source/drain region, and a metal layer on dielectric regions adjacent to the source/drain region. The method further includes selectively etching the metal layer in the vacuum chamber, and selectively forming a metal nitride layer on the metal silicide layer. The selectively forming the metal nitride layer is performed in the vacuum chamber or a vacuum cluster system without vacuum break.

20 Claims, 22 Drawing Sheets

Related U.S. Application Data continuation of application No. 16/206,252, filed on Nov. 30, 2018, now Pat. No. 10,468,260, which is a division of application No. 15/691,871, filed on Aug. 31, 2017, now Pat. No. 10,475,654.

(51) Int. Cl.

| | | |
|---|---|---|
| *H01L 29/417* | (2006.01) | |
| *H01L 21/02* | (2006.01) | |
| *H01L 21/3205* | (2006.01) | |
| *H01L 21/3213* | (2006.01) | |
| *H01L 21/768* | (2006.01) | |
| *H01L 23/535* | (2006.01) | |
| *H01L 29/08* | (2006.01) | |
| *H01L 29/66* | (2006.01) | |
| *H01L 29/78* | (2006.01) | |

(52) U.S. Cl.
CPC .... *H01L 21/3211* (2013.01); *H01L 21/32053* (2013.01); *H01L 21/32135* (2013.01); *H01L 21/76805* (2013.01); *H01L 21/76829* (2013.01); *H01L 21/76889* (2013.01); *H01L 21/76895* (2013.01); *H01L 23/535* (2013.01); *H01L 29/0847* (2013.01); *H01L 29/41791* (2013.01); *H01L 29/665* (2013.01); *H01L 29/66545* (2013.01); *H01L 29/66636* (2013.01); *H01L 29/66795* (2013.01); *H01L 29/7851* (2013.01); *H01L 2029/7858* (2013.01)

(56) References Cited

U.S. PATENT DOCUMENTS

| | | |
|---|---|---|
| 6,204,170 B1 | 3/2001 | Taguwa |
| 6,461,960 B2 | 10/2002 | Lee |
| 7,868,458 B2 | 1/2011 | Lee et al. |
| 8,312,017 B2 | 11/2012 | Martin et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,601,586 B1 * | 3/2017 | Kittl ................. H01L 29/66545 |
| 9,837,510 B2 | 12/2017 | Chang et al. |
| 9,876,112 B2 | 1/2018 | Huang et al. |
| 9,887,129 B2 | 2/2018 | Hsieh et al. |
| 9,922,978 B2 * | 3/2018 | Ching ................. H01L 29/6653 |
| 10,079,210 B2 | 9/2018 | Lee et al. |
| 2007/0105358 A1 * | 5/2007 | Kim ................. H01L 21/76855 |
| | | 438/597 |
| 2015/0041918 A1 * | 2/2015 | Wann ................. H01L 27/0886 |
| | | 257/401 |
| 2015/0132939 A1 | 5/2015 | Hasegawa et al. |
| 2016/0365446 A1 | 12/2016 | Chang et al. |

FOREIGN PATENT DOCUMENTS

| | | |
|---|---|---|
| KR | 20160062717 A | 6/2016 |
| KR | 20160100181 A | 8/2016 |
| KR | 20170042938 A | 4/2017 |
| TW | 201712140 A | 4/2017 |
| TW | 201724273 A | 7/2017 |

OTHER PUBLICATIONS

Norasetthekul, et al., "Dry etch chemistries for TiO2 thin films," Applied Surface Science 185, Aug. 17, 2001, pp. 27-33.

Verhulst et al., "Thermodynamic Behavior of Metal Chlorides and Sulfates under the Conditions of Incineration Furnaces," Environmental Science & Technology, vol. 30, No. 1, 1996, pp. 50-56.

\* cited by examiner

WRAP-AROUND CONTACT PLUG AND METHOD MANUFACTURING SAME

PRIORITY CLAIM AND CROSS-REFERENCE

This application is a continuation of U.S. patent application Ser. No. 16/599,773, entitled "Wrap-Around Contact Plug and Method Manufacturing Same," filed on Oct. 11, 2019, which is a continuation of U.S. patent application Ser. No. 16/206,252, entitled "Wrap-Around Contact Plug and Method Manufacturing Same," filed on Nov. 30, 2018, now U.S. Pat. No. 10,468,260 issued in Nov. 5, 2019, which is a divisional of U.S. patent application Ser. No. 15/691,871, entitled "Wrap-Around Contact Plug and Method Manufacturing Same," filed on Aug. 31, 2017, now U.S. Pat. No. 10,475,654 issued Nov. 12, 2019, which applications are incorporated herein by reference.

BACKGROUND

In the manufacturing of integrated circuits, contact plugs are used for connecting to the source and drain regions and the gates of transistors. The source/drain contact plugs are typically connected to source/drain silicide regions, which are formed by depositing a metal layer, and then performing an anneal to react the metal layer with the silicon of the source/drain regions. A wet etch is then performed to remove the unreacted portion of the metal layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
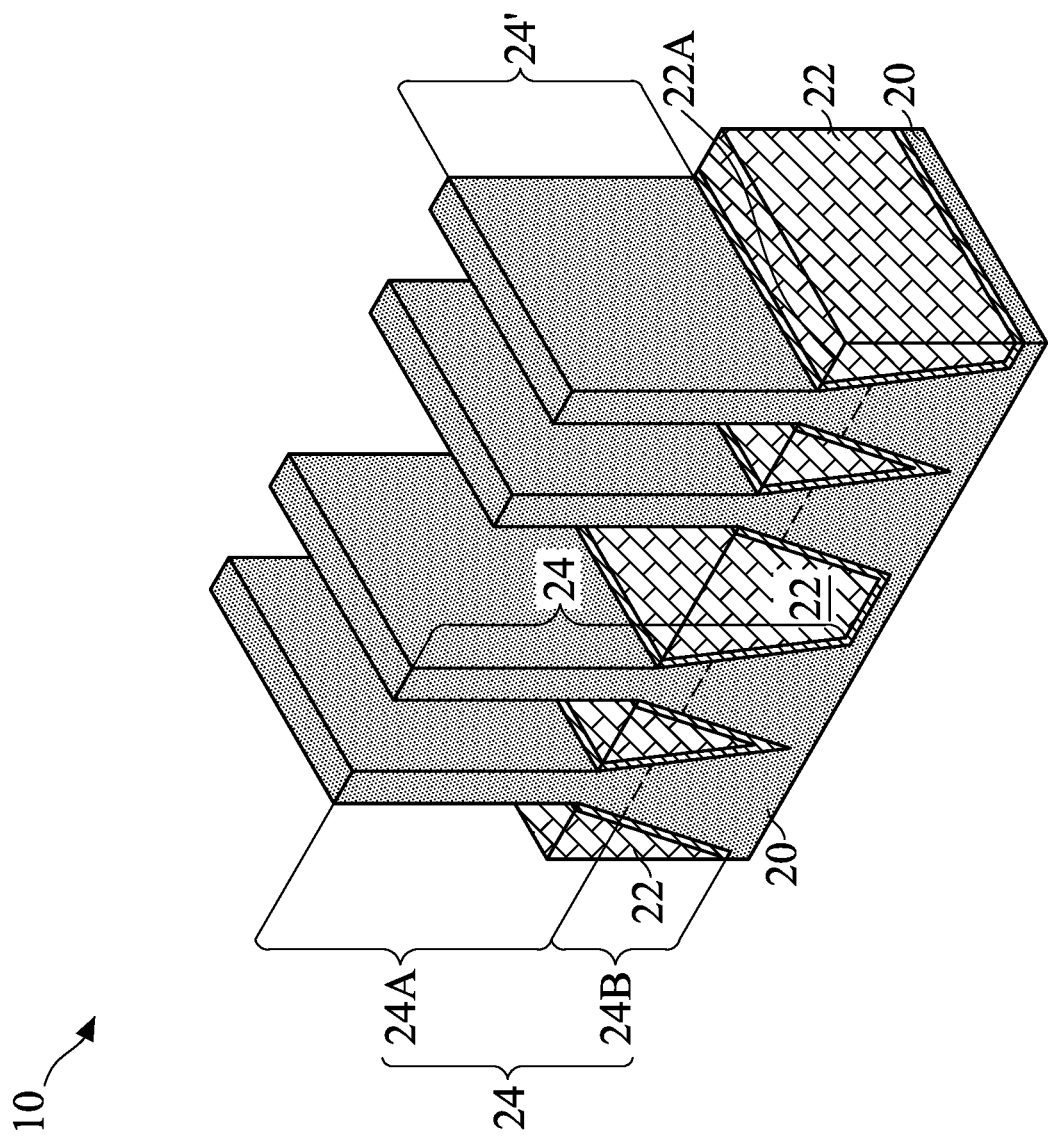
FIGS. 1 through 10E are perspective views and cross-sectional views of intermediate stages in the formation of a transistor and contact structures in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor with contact structures and the method of forming the same are provided in accordance with various exemplary embodiments. The intermediate stages in the formation of the transistors are illustrated in accordance with some embodiments. Some variations of some embodiments are discussed. Throughout the various views and illustrative embodiments, like reference numbers are used to designate like elements.

Figure 19:
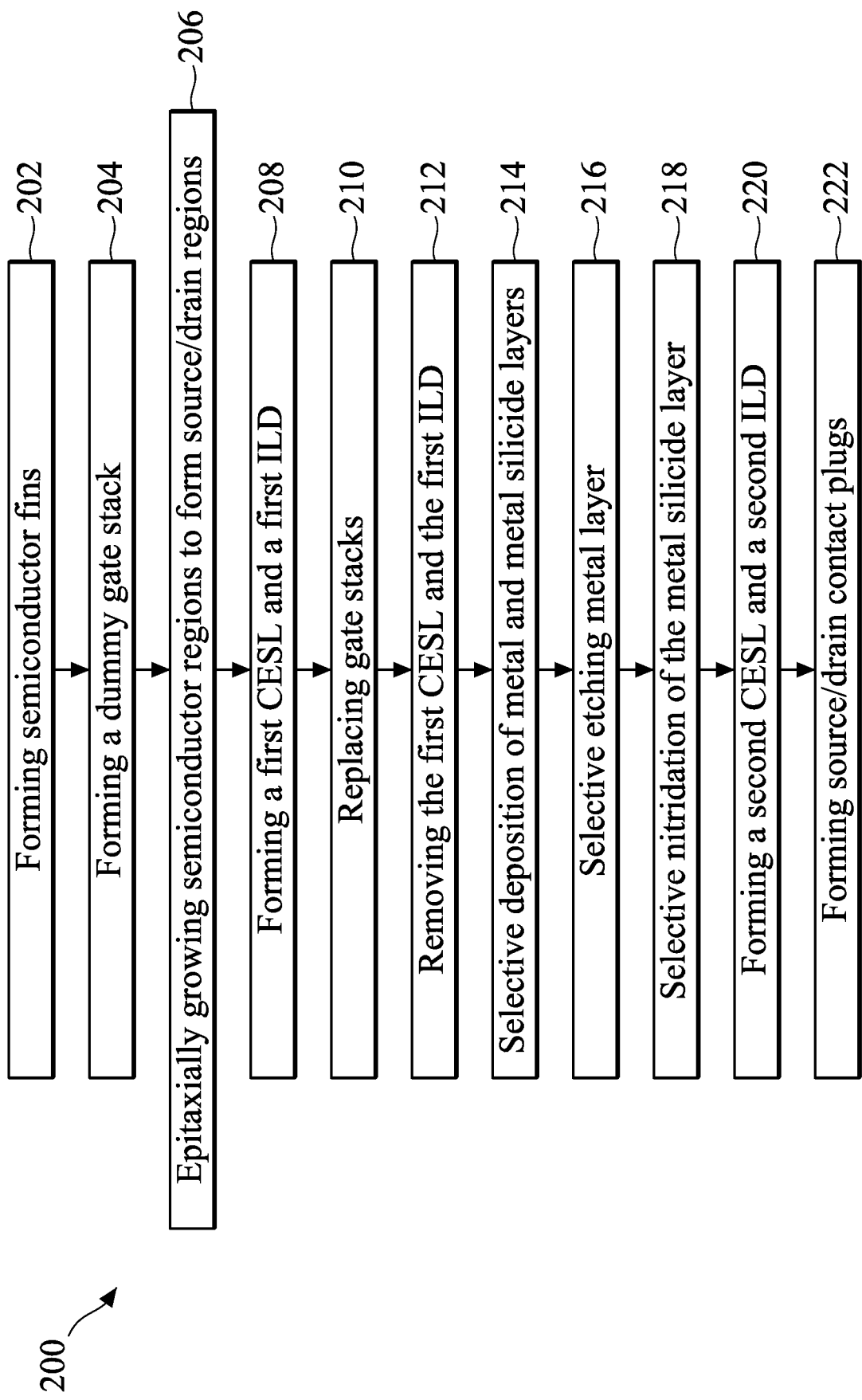
FIG. 19 illustrates a process flow for forming a transistor and contact plugs in accordance with some embodiments.

FIGS. 1 through 10E illustrate the cross-sectional views of intermediate stages in the formation of transistors in accordance with some embodiments of the present disclosure. The steps shown in FIGS. 1 through 10E are also reflected schematically in the process flow shown in FIG. 19.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions are formed to extend from a top surface of substrate 20 into substrate 20. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20.

In accordance with alternative embodiments of the present disclosure, semiconductor strips 24 are replacement strips formed by etching the portions of substrate 20 between STI regions 22 to form recesses, and performing an epitaxy to regrow another semiconductor material in the recesses. Accordingly, semiconductor strips 24 are formed of a semiconductor material different from that of substrate 20. In accordance with some exemplary embodiments, semiconductor strips 24 are formed of silicon germanium, silicon carbon, or a III-V compound semiconductor material. In accordance with some embodiments of the present disclosure, portions 24A of semiconductor strips 24 are replaced with a semiconductor material different from the material of bottom portions 24B. For example, portions 24A may be formed of silicon germanium, silicon carbon, or the like. The bottom portions 24B are portions of the original substrate 20, and are formed of the same semiconductor material (such as silicon) as the underlying bulk portions of substrate 20.

STI regions 22 may include a liner oxide (not shown), which may be a thermal oxide formed through thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, and the dielectric material may be formed using Flowable Chemical Vapor Deposition (FCVD), spin-on, or the like.

STI regions 22 are recessed, so that some top portions 24' of semiconductor strips 24 protrude higher than the top surfaces 22A of the remaining portions of STI regions 22. The respective step is illustrated as step 202 in the process flow 200 shown in FIG. 19. Throughout the description, the top portions 24' are alternatively referred to as semiconductor fins 24' or protruding fins 24'. The etching may be performed using a dry etching process, wherein a mixture of $HF_3$ and $NH_3$ is used as the etching gases. During the etching process, plasma may be generated. Argon may also be included. In accordance with alternative embodiments of the present disclosure, the recessing of STI regions 22 is performed using a wet etch process. The etching chemical may include HF, for example.

Figure 2:
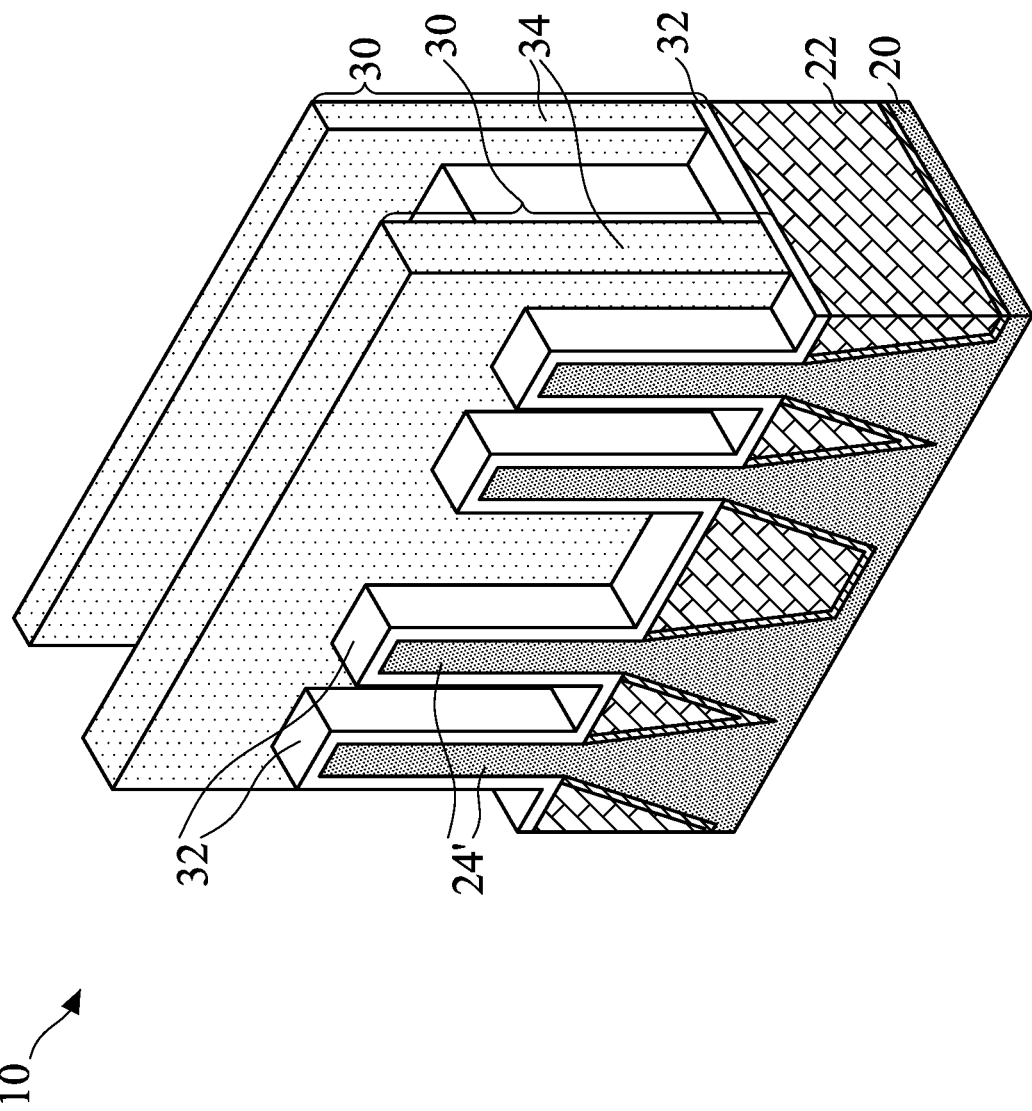

Referring to FIG. 2, dummy gate stacks 30 are formed. The respective step is illustrated as step 204 in the process flow shown in FIG. 19. The formation of dummy gate stacks 30 includes forming dummy gate dielectric layer 32, and a dummy gate electrode layer over dummy dielectric layer 32. The dummy gate electrode layer is patterned to form dummy gate electrodes 34. Throughout the description, dummy gate electrodes 34 and the underlying portions of dummy gate dielectric layer 32 are in combination referred to as dummy gate stacks 30. Dummy gate electrodes 34 may be formed, for example, using polysilicon, and other materials may also be used. Dummy gate stacks 30 may include one or more mask layers (not shown), which may be formed of silicon nitride, silicon oxide, silicon carbo-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'. After the patterning of the dummy gate electrode layer, dummy gate dielectric layer 32 is exposed, and covers the sidewalls and the top surfaces of protruding fins 24'.

Figure 3:
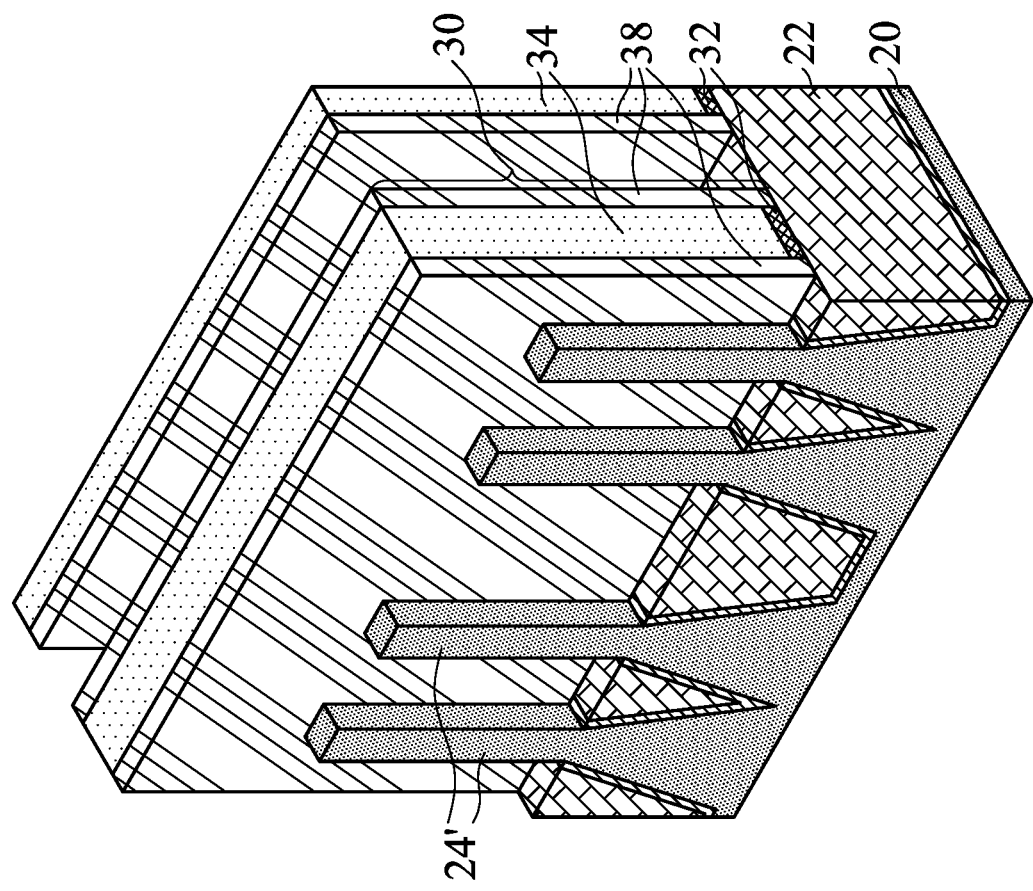

Next, an etch step is performed, and the exposed portions of dummy gate dielectric layer 32 are removed, as shown in FIG. 3. Gate spacers 38 are formed on the sidewalls of dummy gate stacks 30. In accordance with some embodiments of the present disclosure, gate spacers 38 are formed of a dielectric material such as silicon nitride, silicon carbo-nitride, or the like, and may have a single-layer structure or a multi-layer structure including a plurality of dielectric layers.

Figure 4:
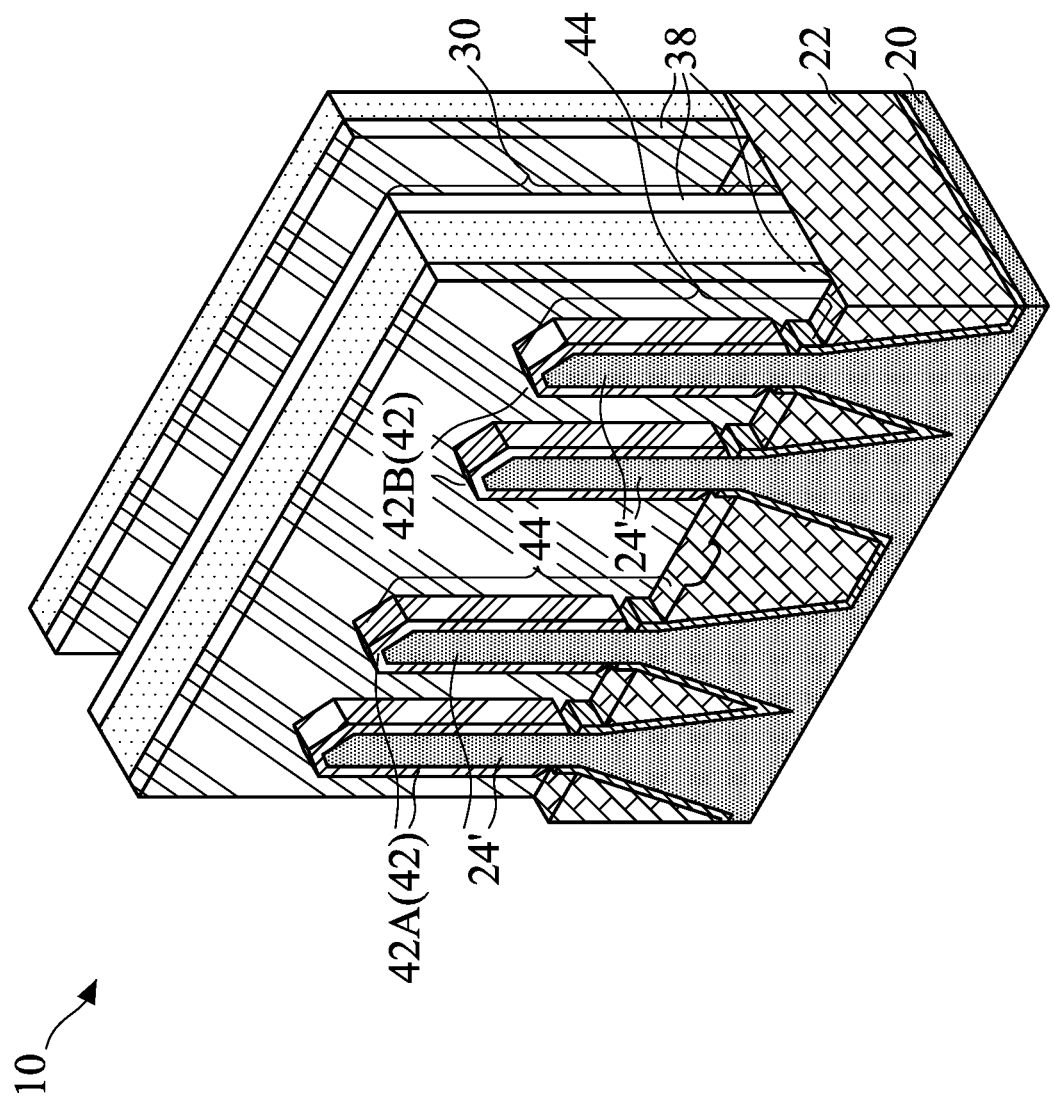

Next, source/drain regions are formed. In accordance with some embodiments of the present disclosure, the source/drain regions are formed as cladding source/drain regions, as shown in FIG. 4, in which epitaxy semiconductor regions 42 (including 42A and 42B) are epitaxially grown on the exposed protruding fins 24'. The respective step is illustrated as step 206 in the process flow shown in FIG. 19. Epitaxy regions 42A and 42B represent the epitaxy regions for forming different types of FinFETs. Depending on whether the resulting FinFETs is a p-type FinFET or an n-type FinFET, a p-type or an n-type impurity may be in-situ doped with the proceeding of the epitaxy. For example, epitaxy regions 42A may include silicon germanium boron (SiGeB), and the resulting FinFET is a p-type FinFET. Epitaxy regions 42B may include silicon phosphorous (SiP) or silicon carbon phosphorous (SiCP), and the respective resulting FinFET is an n-type FinFET. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. When epitaxy regions 42A and 42B are formed of different materials, they are formed in different epitaxy processes, and the corresponding masks (not shown) are used to allow the epitaxy occurs on one of epitaxy regions 42A and 42B, but not on the other.

Figure 6A:
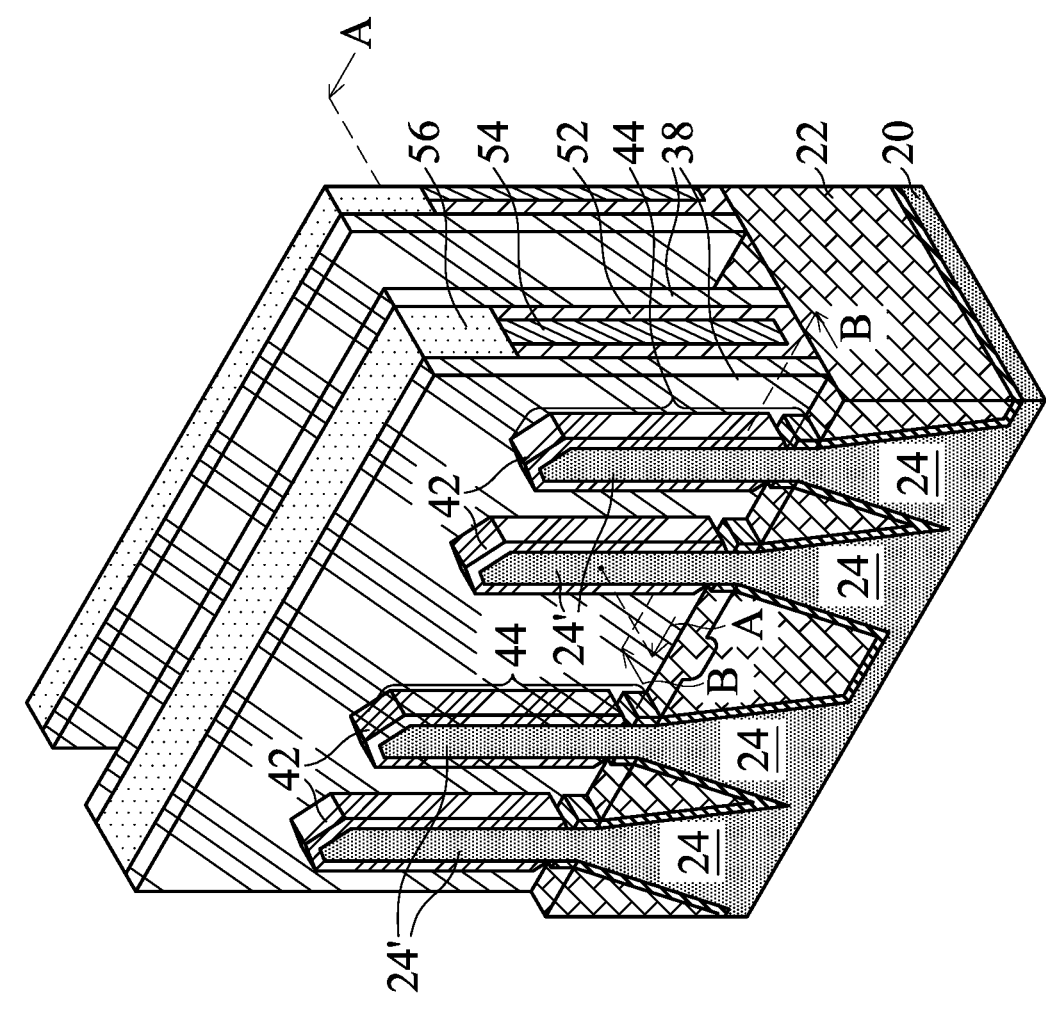

In accordance with alternatively embodiments, instead of directly growing epitaxy regions on protruding fins 24', an etching step (referred to as source/drain recessing hereinafter) is performed to etch the portions of protruding fins 24' that are not covered by dummy gate stack 30 and gate spacers 38, so that recesses are formed. Epitaxy regions 42 are then grown from recesses. Exemplary resulting epitaxy regions 42 are shown in FIG. 6E.

An implantation step(s) may be performed to implant the desirable p-type or n-type impurity such as boron or phosphorous into protruding fins 24' and epitaxy regions 42A and 42B. The protruding fins 24' and the corresponding epitaxy regions 42A and 42B in combination are referred to as source/drain regions 44. In accordance with alternative embodiments of the present disclosure, the implantation step is skipped when epitaxy regions 42 are in-situ doped with the p-type or n-type impurity.

Figure 5:
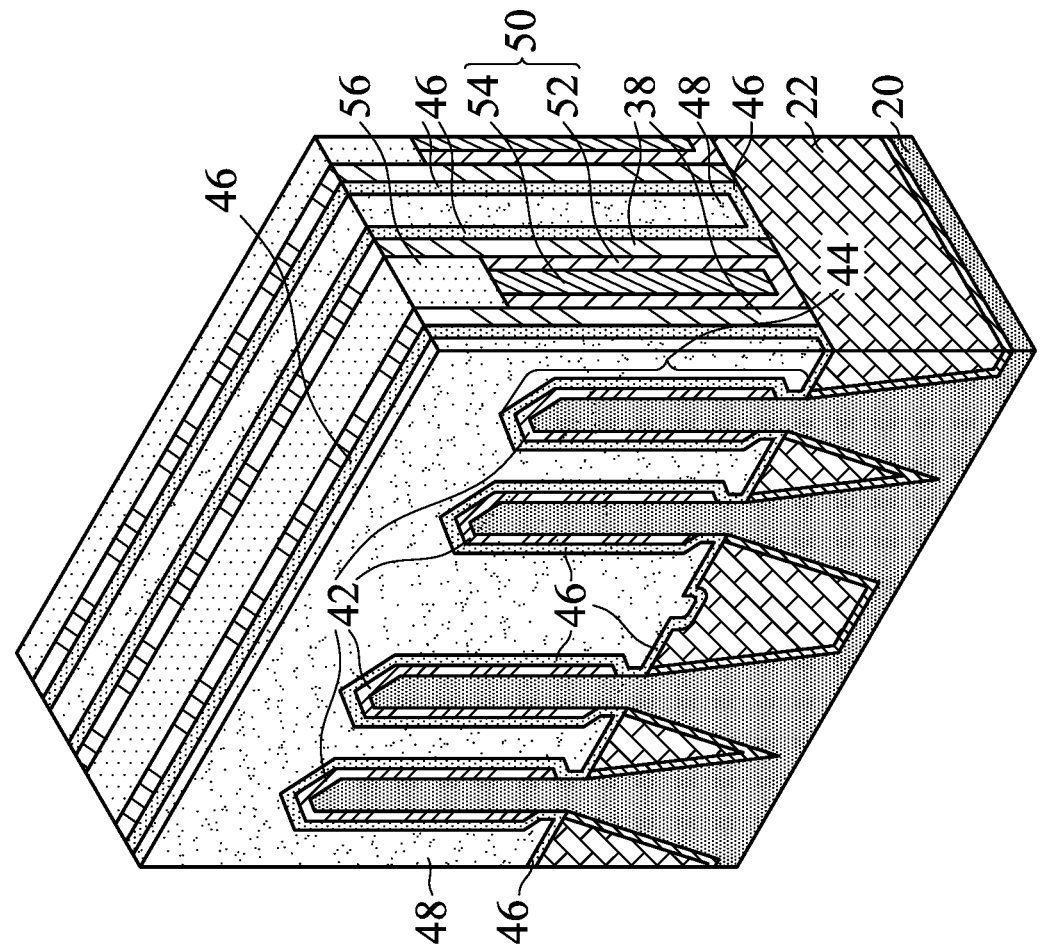

FIG. 5 illustrates a perspective view of the structure after the formation of Contact Etch Stop Layer (CESL) 46 and Inter-Layer Dielectric (ILD) 48. The respective step is illustrated as step 208 in the process flow shown in FIG. 19. CESL 46 may not be formed in accordance with some embodiments of the present disclosure, and when formed, may be formed of silicon nitride, silicon carbo-nitride, or the like. In accordance with some embodiments of the present disclosure, CESL 46 is free from oxygen therein. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding may be performed to level the top surfaces of ILD 48, dummy gate stacks 30 (FIG. 4), and gate spacers 38 with each other.

After the formation of CESL 46 and ILD 48, the dummy gate stacks 30 as shown in FIG. 4 are replaced with replacement gate stacks 50 as shown in FIG. 5. The respective step is illustrated as step 210 in the process flow shown in FIG. 19. The formation of replacement gate stacks 50 includes performing etching steps to remove dummy gate stacks 30 (FIG. 4), forming one or more gate dielectric layer, depositing a plurality of conductive layers such as metal layers, and performing a planarization such as CMP or mechanical grinding to remove excess portions of the gate dielectric layer and the metal layers. The resulting replacement gate stack 50 includes gate dielectric 52 and gate electrode 54, as shown in FIG. 5.

In accordance with some embodiments of the present disclosure, gate dielectric 52 includes an Interfacial Layer (IL, not shown separately) as its lower part. The IL is formed on the surfaces of protruding fins 24'. The IL may include an oxide layer such as a silicon oxide layer, which is formed through the thermal oxidation of protruding fins 24', a chemical oxidation process, or a deposition process. Gate dielectric 52 may also include a high-k dielectric layer (not shown separately) over the IL. The high-k dielectric layer includes a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Gate electrode 54 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), a barrier layer, which may be another TiN layer, is formed. Gate electrode 54 may also include a filling metal, which may be formed of aluminum, tungsten, or cobalt.

After the formation of replacement gate stacks 50, gate stacks 50 are recessed, followed by filling hard masks 56 into the resulting recesses. Hard masks 56 are formed of a dielectric material such as silicon nitride. A planarization step is performed to level the top surface of hard masks 56 with ILD 48.

After the formation of replacement gates 50 and hard masks 56, CESL 46 and ILD 48 are removed, for example, through etching. The respective step is illustrated as step 212 in the process flow shown in FIG. 19. The resulting structure is shown in FIG. 6A. In accordance with some embodiments of the present disclosure, the etching is performed to remove all CESL 46 and ILD 48 throughout wafer 10. Accordingly, in the etching, there is no mask formed to protect some portions of CESL 46 and ILD 48. Epitaxy regions 42 are exposed as a result of the removal of CESL 46 and ILD 48.

FIGS. 6B, 6C, 6D, and 6E illustrate the cross-sectional views of some portions of the structure shown in FIG. 6A. Throughout FIGS. 6A through 10E, each of the figure numbers may include letter "A," "B," "C," "D," or "E." Letter "A" indicates that the respective figure is a perspective view, and letters "B," "C," "D," and "E" indicates that the corresponding figures illustrate the cross-sectional views of the structure shown in the respective perspective view. The cross-sectional views shown in Figures with letter 13" are obtained from the plane same as the vertical plane containing line A-A in FIG. 6A, which vertical plane cuts through semiconductor strips 24 and protruding fin 24'. Also, letters "C," "D," and "E" indicate that the respective figures are obtained from the plane same as the vertical plane containing line B-B in the respective perspective view. Furthermore, letters "C," "D," and "E" indicate that the respective figures reflective different embodiments.

Figure 6C:
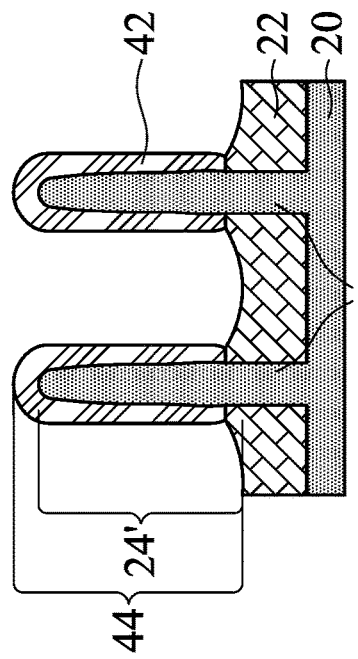
Figure 6E:
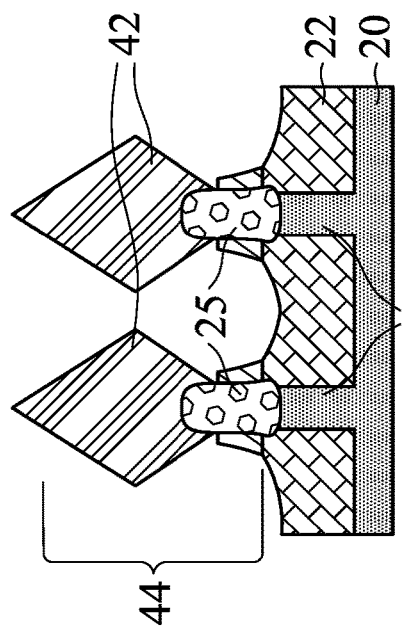
Figure 6B:
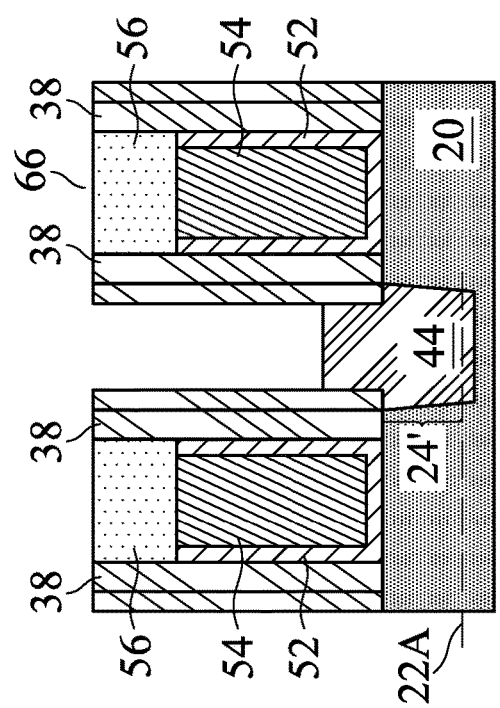

Referring to FIG. 6B, the top surface 22A of STI regions 22 (not in the illustrated plane) is illustrated, and protruding fin 24' will be higher than top surface 22A. The detailed structure of source/drain regions 44 may be found in FIGS. 6C, 6D, and 6E, which illustrate the structures of source/drain regions 44 in accordance with various embodiments.

FIG. 6C illustrates the cross-sectional view of cladding source/drain regions 44, which include epitaxy semiconductor regions 42 grown on protruding fins 24'. In accordance with some embodiments of the present disclosure, protruding fins 24' are the remaining portions of the original substrate, and hence the material of protruding fins 24' is the same as the material of the underlying bulk portion of substrate 20.

Figure 6D:
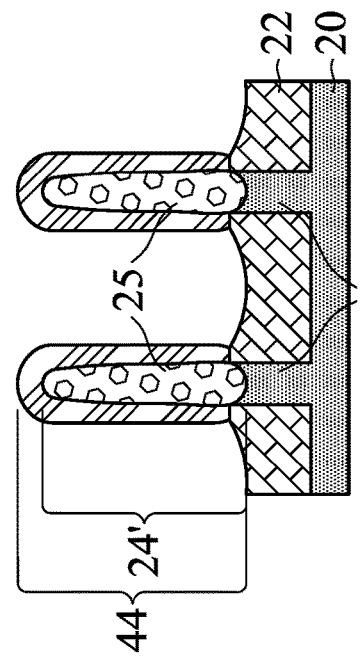

FIG. 6D illustrates the cross-sectional view of cladding source/drain regions 44, which include epitaxy semiconductor regions 42 grown on protruding fins 24'. In accordance with some embodiments of the present disclosure, protruding fins 24' are re-grown from the original substrate, and hence the material of protruding fins 24' is different from the material of the underlying bulk portion of substrate 20. The re-grown semiconductor material, which are re-grown from the recesses formed between STI regions, are marked as semiconductor regions 25.

FIG. 6E illustrates the cross-sectional view of regrown source/drain regions 44, which include epitaxy semiconductor regions 42 grown from the recesses formed after etching protruding fins. The resulting source/drain regions 44 may include facets. In accordance with some embodiments, replacement fins are formed, as shown as semiconductor regions 25, and are recessed again. Accordingly, epitaxy regions 42 are grown from semiconductor regions 25.

Figure 7A:
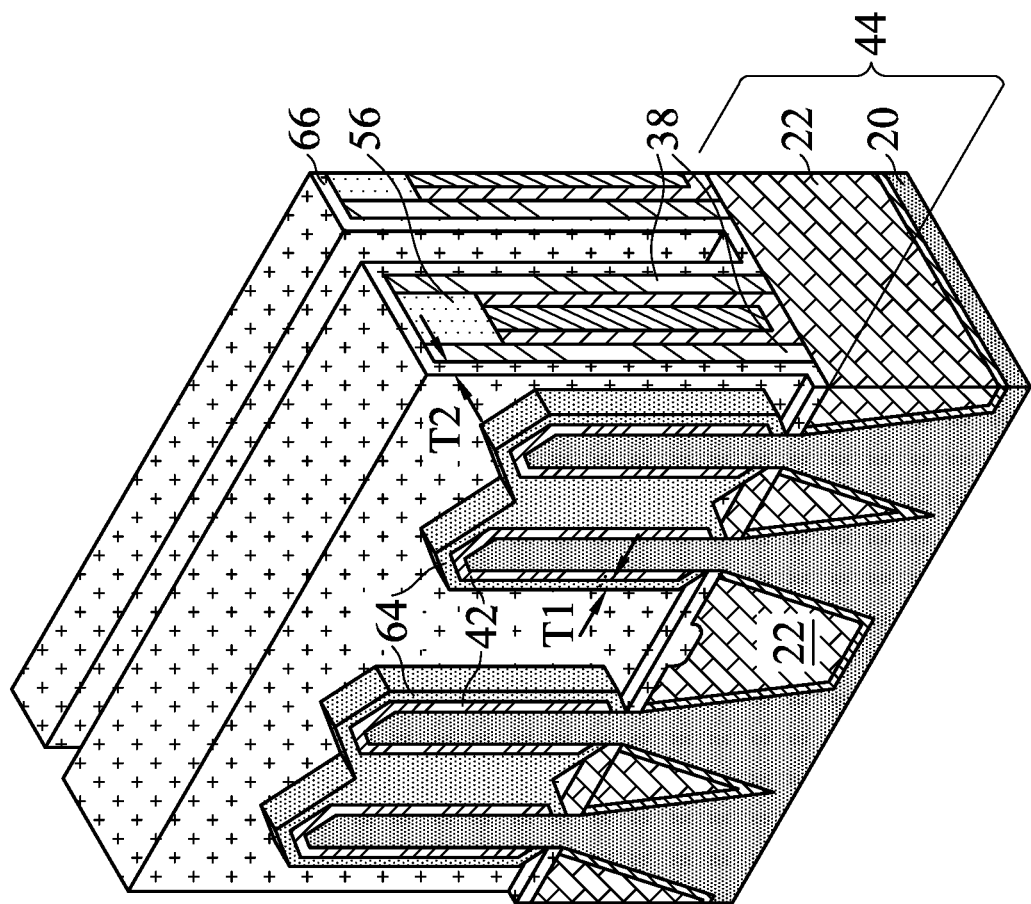
Figure 18:
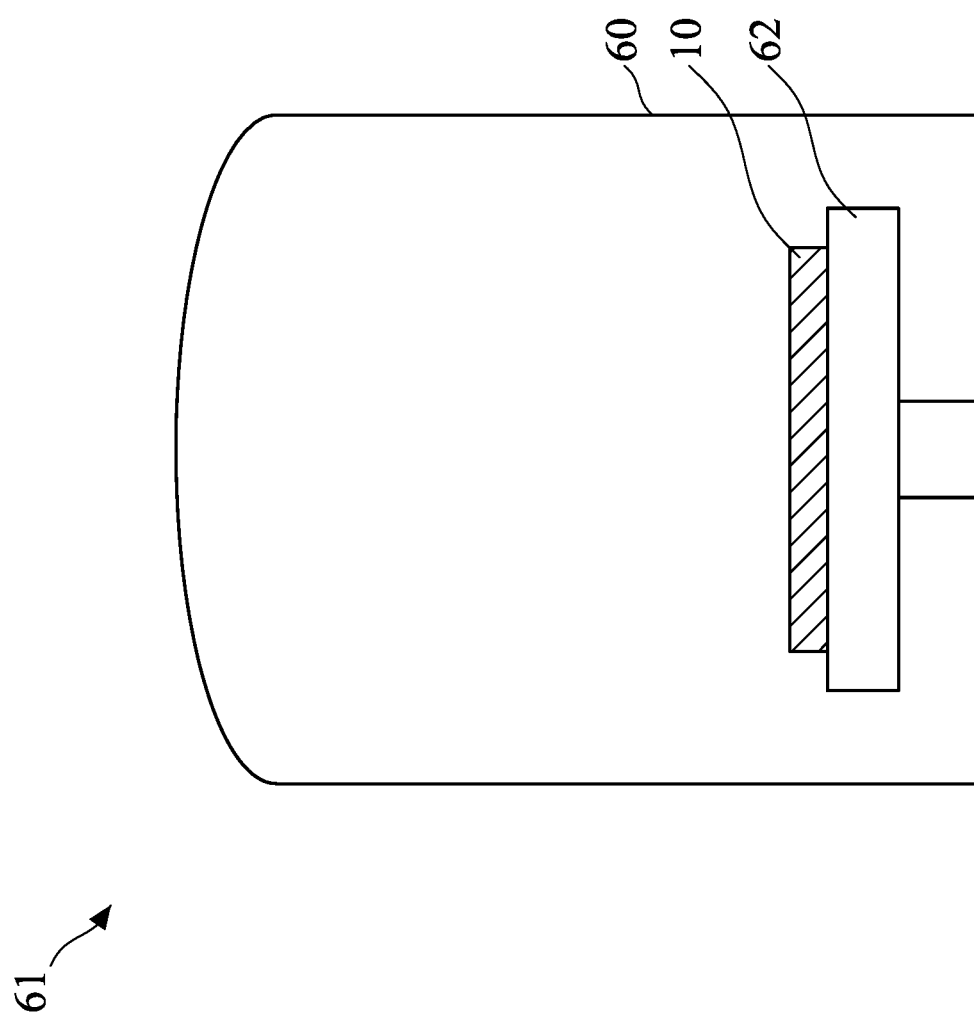
FIG. 18 schematically illustrates a wafer processed in a vacuum chamber in accordance with some embodiments.

FIGS. 7A through 9E illustrate the perspective views and cross-sectional views in the formation of source/drain silicide regions and metal nitrides in accordance with some embodiments. The steps shown in FIGS. 7A through 9E may be performed in a same production tool such as a deposition tool, and may be performed in a same vacuum environment in the production tool. For example, FIG. 18 schematically illustrates vacuum chamber 60 in deposition tool 61. Vacuum chamber 60 can be vacuumed to provide a vacuum environment. Chuck 62 is located in vacuum chamber 60. Wafer 10 is placed on chuck 62 in order to perform the steps shown in FIGS. 7A through 9E. The steps shown in FIGS. 7A through 9E may be performed with no vacuum break occurring during the period of time starting at the time the step shown in FIG. 7A is started and ending at the time the step shown in FIG. 9A is ended. By maintaining the vacuum during these process steps, the exposed features such as semiconductor regions and metal regions do not suffer from oxidation. Accordingly, there is no need to remove the (non-existent) oxide.

After wafer 10 is placed into the production tool (FIG. 18), a vacuum environment is formed by vacuuming vacuum chamber 60 in FIG. 18 (or a cluster system including a plurality of vacuum chambers sharing a common vacuum environment). A cleaning step is then performed, which is referred to as in-situ cleaning. The in-situ cleaning step removes the undesirable oxide formed on the surface of source/drain regions 44, which are shown in FIGS. 6A, 6B, 6C, 6D, and 6E. The removed oxide may be silicon oxide, silicon-germanium oxide, or the like, depending on the material of sourced/drain regions 44. In accordance with some embodiments of the present disclosure, the cleaning is performed using a mixture of process gases including $NF_3$ and $NH_3$, or a mixture of HF and $NH_3$.

After the cleaning step, an in-situ selective deposition is performed in the same vacuum environment as the cleaning step. The respective step is illustrated as step 214 in the process flow shown in FIG. 19. Accordingly, after the cleaning, no new oxide is generated on the surfaces of source/drain regions 44. The resulting structure is shown in FIGS. 7A, 7B, 7C, 7D, and 7E. In accordance with some embodiments of the present disclosure, the in-situ selective deposition is performed using process gases including a metal halide (such as $TiCl_4$) and hydrogen ($H_2$). In accordance with some embodiments of the present disclosure, the flow rate of $TiCl_4$ is in the range between about 5 sccm and about 15 sccm, and the flow rate of hydrogen is in the range between about 30 sccm and about 70 sccm. The power may be in the range between about 200 Watts and about 500 Watts. The deposition temperature may be in the range between about 400° C. and about 500° C. The selective deposition may last between about 40 seconds and about 60 seconds, depending on the desirable thickness of the deposited layers. During the selective deposition, plasma is turned on.

The selective deposition is selective since on source/drain regions 44, what are deposited is metal silicide layer 64, which is formed as a result of the deposition of metal and the silicide reaction of the metal and surface layers of source/drain regions 44. This is due to the appropriate process conditions including the elevated deposition temperature and appropriate deposition rate. On the other hand, on the surfaces of dielectric layers including gate spacers 38, hard masks 56, and STI regions 22, a metal layer (such as titanium layer) 66 is formed, which is not silicided. The formation of metal silicide layer 64 and the formation of metal layer 66 are concurrent. In accordance with some embodiments of the present disclosure, metal silicide layer 64 has thickness T1 in the range between about 2 nm and about 8 nm, and thickness T2 of metal layer 66 is in the range between about 0.5 nm and about 5 nm. The formation method may include Atomic Layer Deposition (ALD), Chemical Vapor Deposition (CVD), or the like.

FIGS. 7B, 7C, 7D, and 7E illustrate the cross-sectional views of source/drain regions 44 and metal silicide layer 64 in accordance with various embodiments. Metal silicide layer 64 is formed on the top surface and the sidewalls of source/drain regions 44. The shapes of metal silicide layer 64 depend on the shapes of the underlying source/drain regions 44. On the top surface of STI regions 22, there may be some small and thin portions of metal layer 66 formed. The thicknesses of these portions of titanium 66 are not uniform.

After the in-situ selective deposition, an in-situ selective etching step is performed in the same vacuum environment as the in-situ selective deposition. The respective step is illustrated as step 216 in the process flow shown in FIG. 19. The resulting structure is shown in FIGS. 8A, 8B, 8C, 8D, and 8E. In accordance with some embodiments of the present disclosure, the in-situ selective etching is performed using etching gases including a metal halide (such as $TiCl_4$), hydrogen ($H_2$), and argon. It is noted that the metal halide in the etching gas may be changed to different halides (or metal halides) if metal layer 66 is formed of other metals other than titanium. For example, HCl may be used in accordance with some embodiments. In accordance with some embodiments of the present disclosure, the flow rate of $TiCl_4$ is in the range between about 20 sccm and about 30 sccm, the flow rate of hydrogen is in the range between about 1,100 sccm and about 1,500 sccm, and the flow rate of argon is in the range between about 1,100 sccm and about 1,500 sccm. Wafer 10 is heated during the selective etching, and the temperature of the wafer may be in the range between about 400° C. and about 500° C. During the selective etching, plasma may be turned off.

Figure 7B:
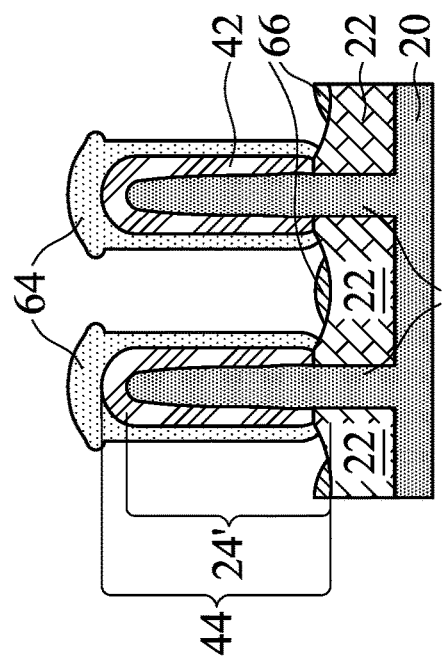
Figure 7C:
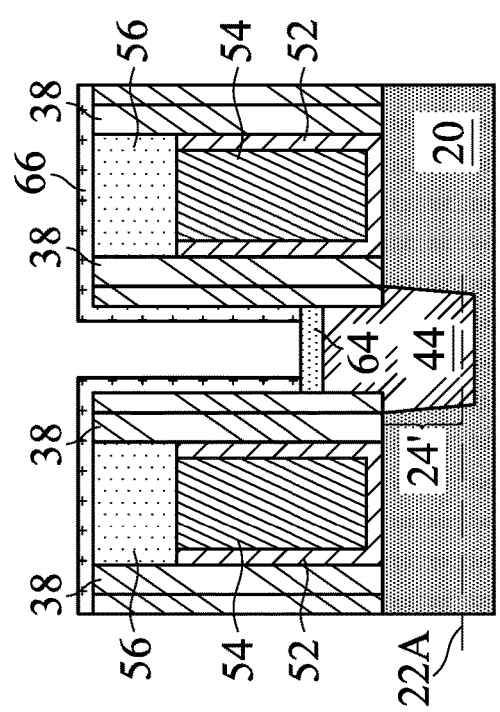
Figure 7D:
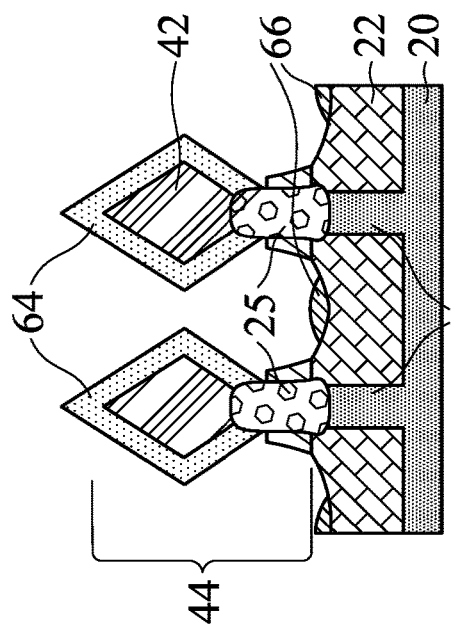
Figure 7E:
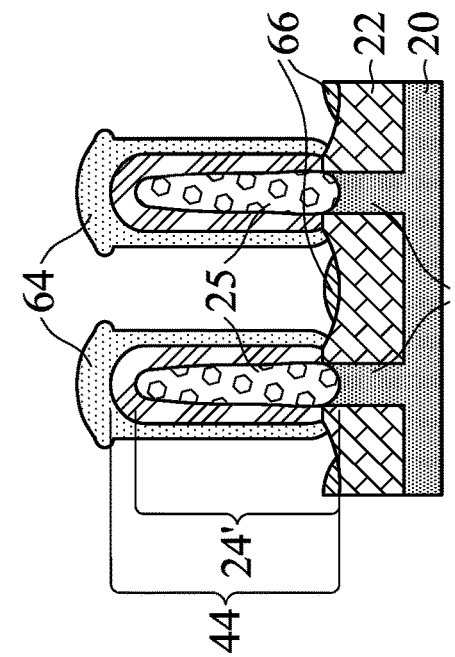
Figure 8A:
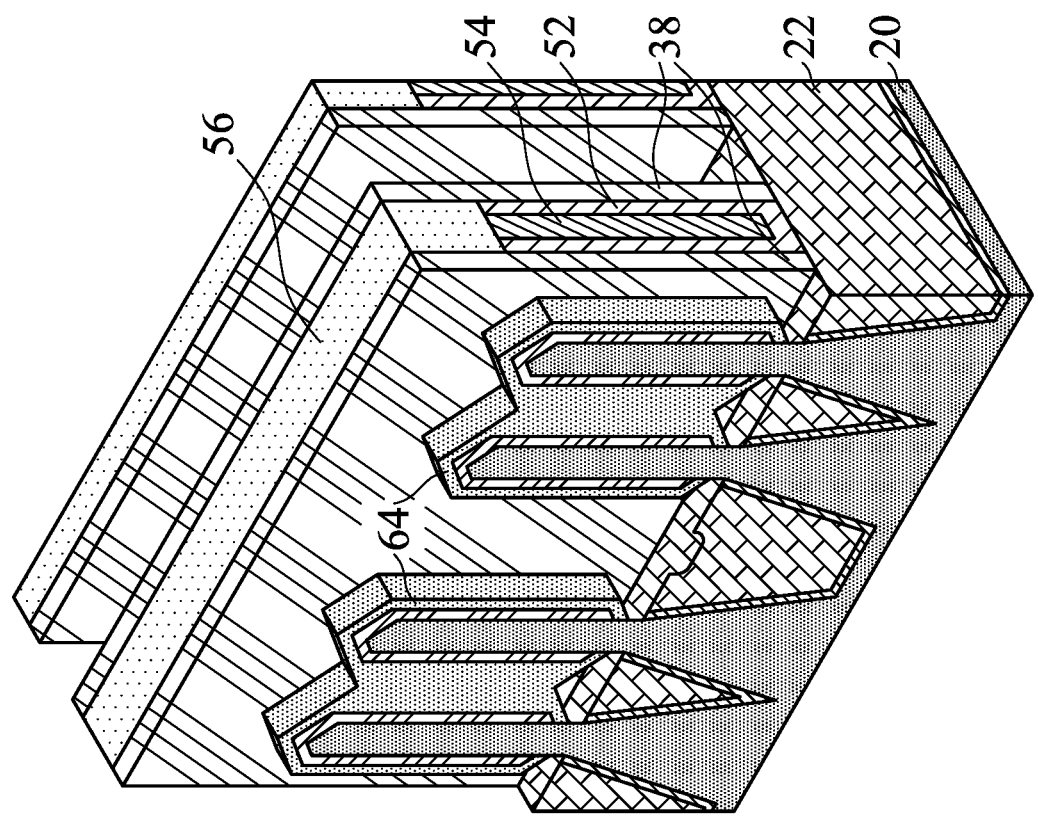
Figure 8B:
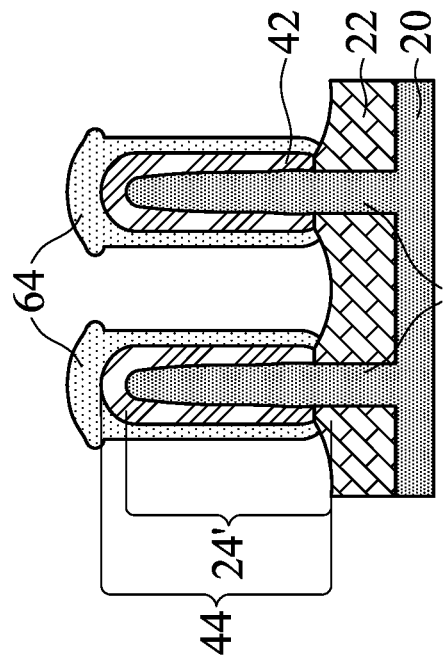
Figure 8C:
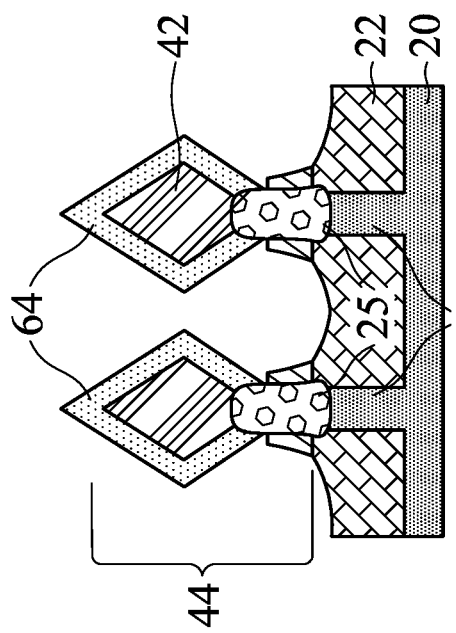
Figure 8D:
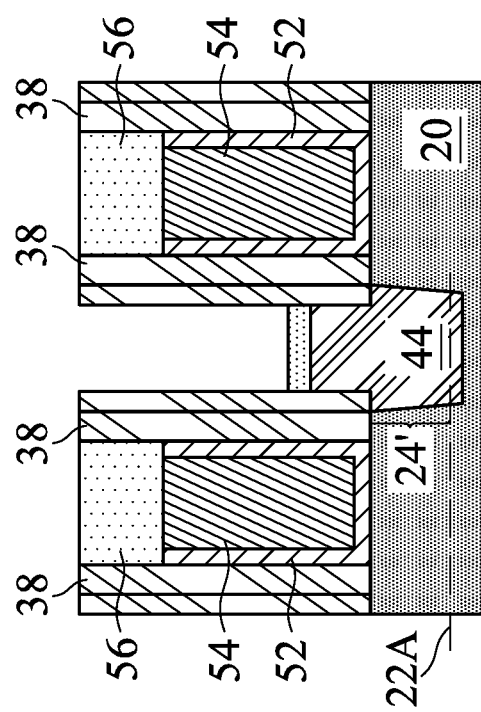
Figure 8E:
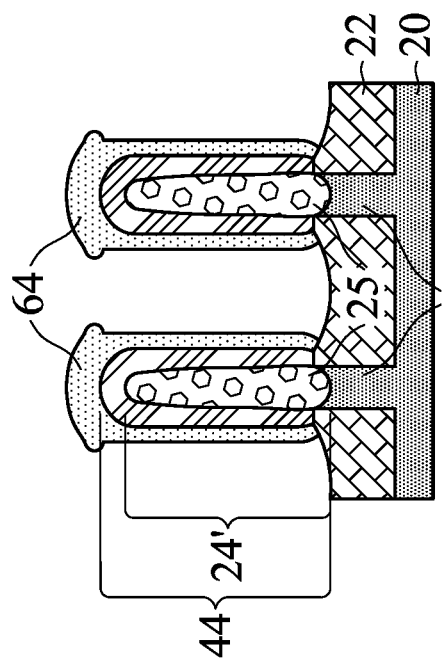
Figure 9A:
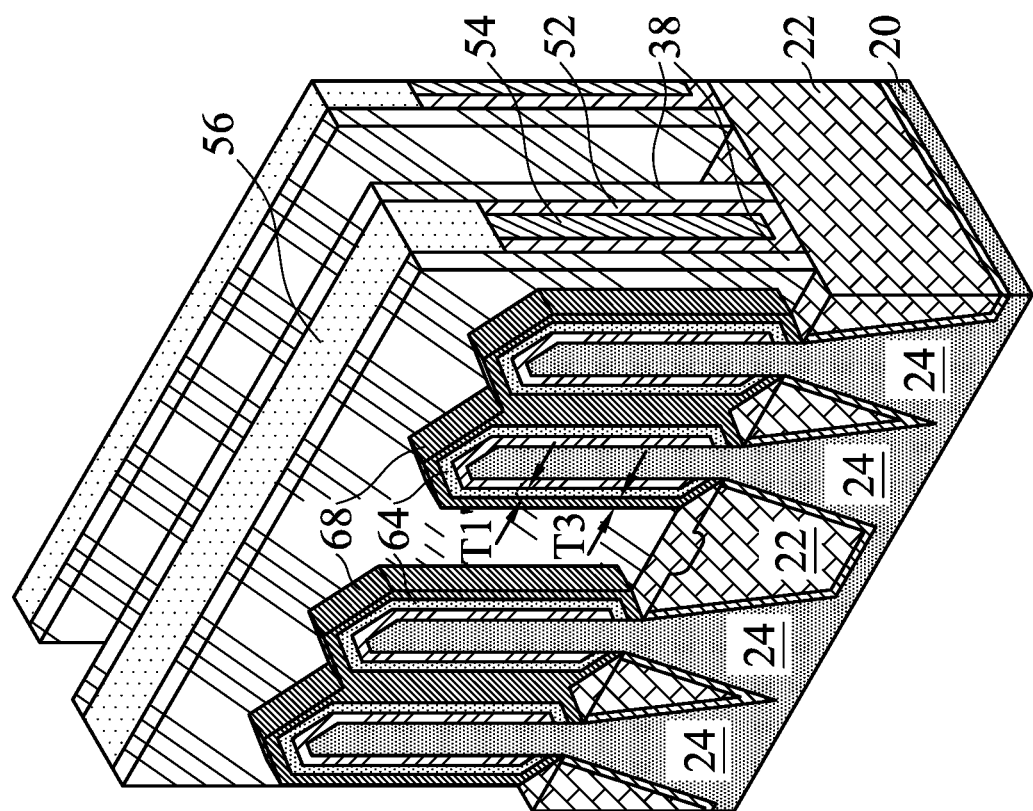
Figure 9B:
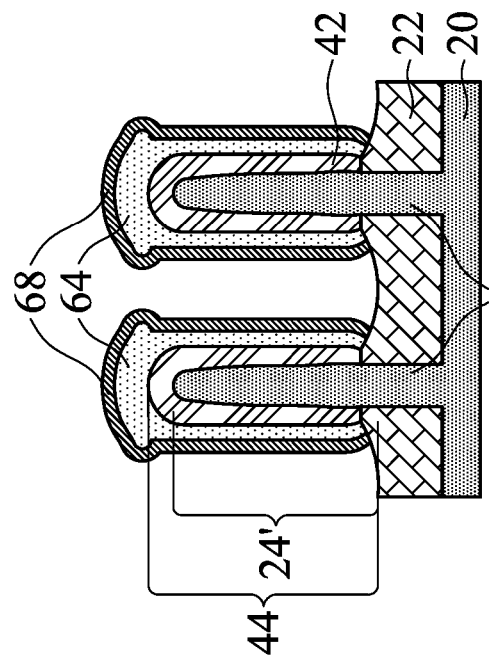
Figure 9C:
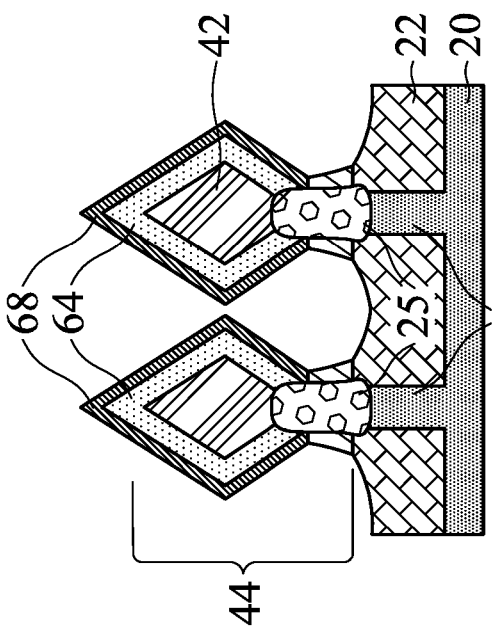
Figure 9D:
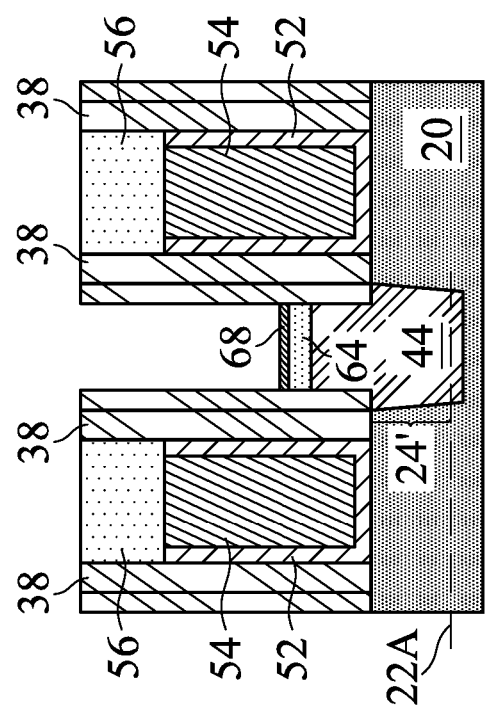
Figure 9E:
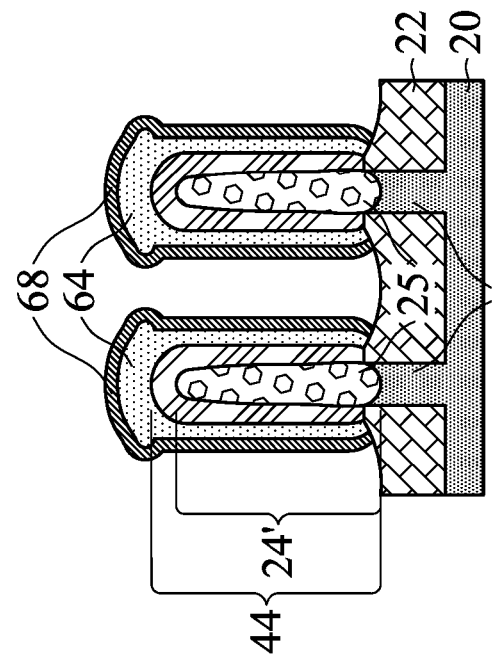
Figure 10A:
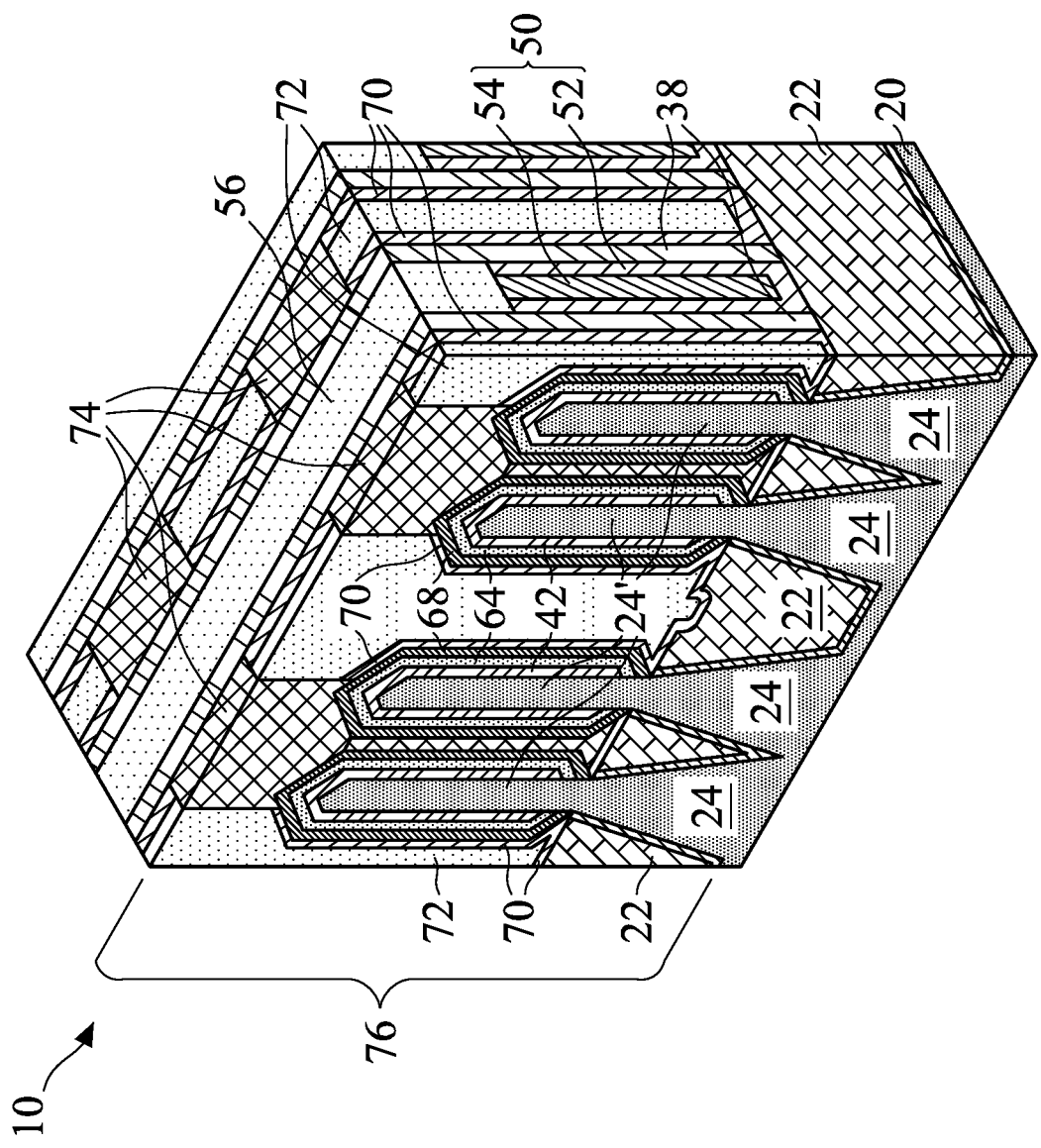
Figure 10B:
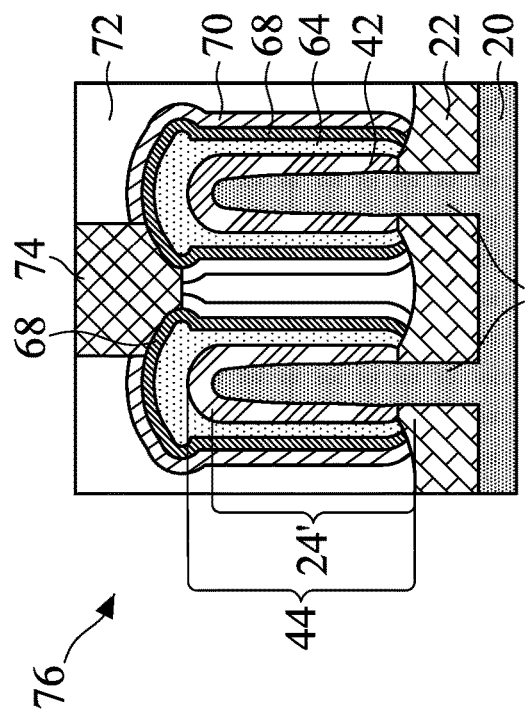
Figure 10C:
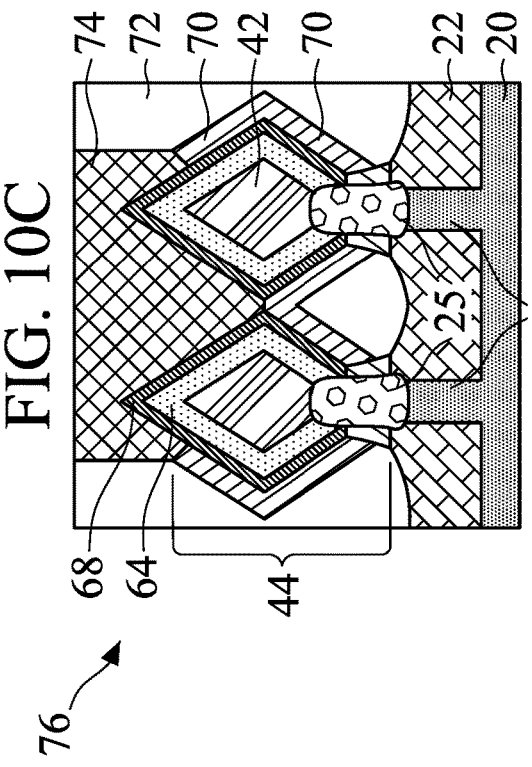
Figure 10D:
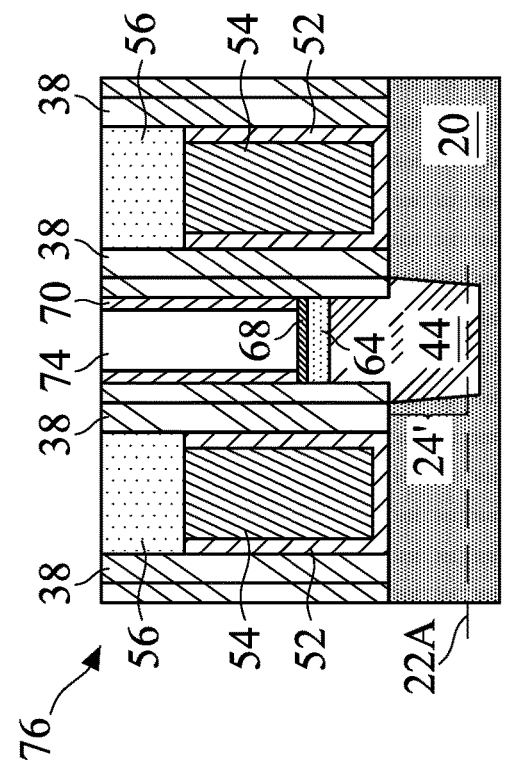
Figure 10E:
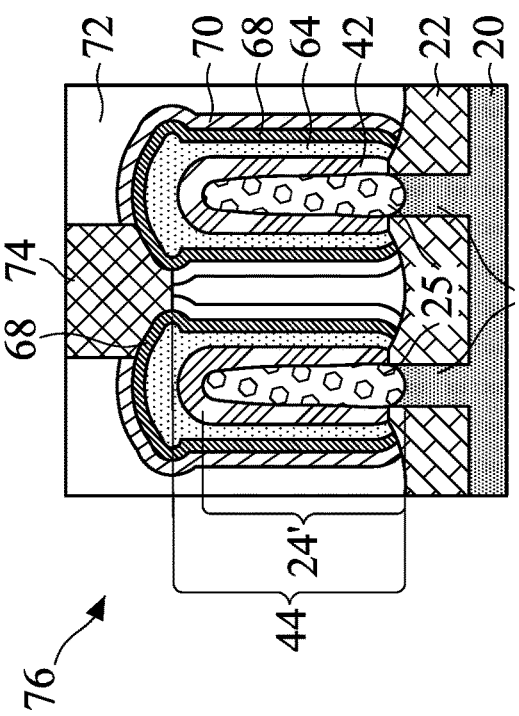

During the selective etching, metal layer 66 as shown in FIGS. 7A and 7B is etched. Metal silicide layer 64, on the other hand, is not etched. As a result, gate spacers 38 and hard masks 56 are exposed again.

In accordance with some embodiments, the process gases for the selective deposition and the selective etching are common. For example, $TiCl_4$ and hydrogen may be used in both the selective deposition and the selective etching. In accordance with these embodiments, plasma may be turned on to result in the selective deposition, while the plasma may be turned off to result in the selective etching. Also, process conditions such as flow rates of the process gases are changed between the selective deposition and the selective etching.

FIGS. 8B, 8C, 8D, and 8E illustrate the cross-sectional views of source/drain regions 44 and metal silicide layer 64. In accordance with some embodiments of the present disclosure, all of the metal layer 66 on the top surfaces of STI regions 22 are removed. In accordance with alternative embodiments, the thicker portions (refer to FIGS. 7C, and 7E) of metal layer 66 may have some residue portions left the top surfaces of STI regions 22. The residue portions, however, are discontinuous, and hence will not affect the electrical performance of the resulting FinFET.

After the selective etching, an in-situ nitridation is performed in the same vacuum environment as the selective etching step. The respective step is illustrated as step 218 in the process flow shown in FIG. 19. The resulting structure is shown in FIGS. 9A, 9B, 9C, 9D, and 9E. In accordance with some embodiments of the present disclosure, the in-situ nitridation is performed using a nitrogen-containing process gas such as ammonia ($NH_3$). In accordance with some embodiments of the present disclosure, the flow rate of ammonia is in the range between about 3,000 sccm and about 5,000 sccm. The power may be in the range between about 400 Watts and about 600 Watts. The deposition temperature may be in the range between about 400° C. and about 500° C. The nitridation may last between about 15 seconds and about 25 seconds, depending on the desirable thickness of the nitride layer and the thickness of metal silicide layer 64.

The selective nitridation results in a top surface layer of metal silicide layer 64 to be nitridated to form metal silicon nitride layer 68, which may be a titanium silicon nitride (TiSiN) layer. The bottom layer of metal silicide layer 64 remains not nitridated, and is free from nitrogen. In accordance with some embodiments of the present disclosure, the remaining metal silicide layer 64 has thickness T1' in the range between about 2 nm and about 7 nm, and thickness T3 of titanium silicon nitride layer 68 is in the range between about 1 nm and about 3 nm. It is observed that since titanium silicon nitride layer 68 is formed by nitridating titanium silicide layer 64, metal silicon nitride layer 68 is formed on metal silicide layer 64, but not on dielectric materials such as STI regions 22, gate spacers 38, and hard masks 56.

FIGS. 9B, 9C, 9D, and 9E illustrate the cross-sectional views of source/drain region 44, metal silicide layer 64, and metal silicon nitride layer 68 in accordance with various embodiments. As shown in FIGS. 9B, 9C, 9D, and 9E, metal silicon nitride layer 68 wraps around metal silicide layer 64.

FIGS. 10A, 10B, 10C, 10D, 10D, and 10E illustrate the formation of CESL 70, ILD 72, and contact plugs 74. The respective step is illustrated as steps 220 and 222 in the process flow shown in FIG. 19. FinFET 76 is thus formed. The formation of CESL 70 and ILD 72 may include forming a blanket CESL layer throughout wafer 10 and extending into the gaps between gate spacers 38, filling the remaining gaps with ILD 72, and performing a planarization such as CMP or mechanical grinding. CESL 70 may be formed of a material selected from the same group of candidate materials for forming CESL 46 (FIG. 5), and ILD 72 may be formed of a material selected from the same group of candidate materials for forming ILD 48 (FIG. 5). CESL 70 is a conformal layer, which may be formed through, for example, ALD. Accordingly, CESL 70 wraps around all exposed surfaces in the gaps.

ILD 72 and CESL 70 are then etched to form contact openings (filled by contact plugs 74 as shown in FIGS. 10A, 10B, 10C, 10D, and 10E). Accordingly, metal silicon nitride layer 68 is exposed to the contact openings. Next, the contact openings are filled with a conductive material to form contact plugs 74. In accordance with some embodiments of the present disclosure, the formation of contact plugs 74 includes blanket depositing a conformal barrier layer (not shown separately) extending into the contact openings, and depositing a metallic material over the barrier layer and filling the remaining contact openings. The barrier layer may be formed of titanium nitride or tantalum nitride. The metallic material may be formed of cobalt, tungsten, aluminum, or the like. A planarization is then performed to remove excess portions of the barrier layer and the metallic material. In accordance with alternative embodiments, contact plugs 74 include the metallic material such as cobalt, tungsten, aluminum, and do not include the barrier layer.

FIGS. 10B, 10C, 10D, and 10E illustrate the cross-sectional views of CESL 70, ILD 72, and contact plugs 74 in accordance with some embodiments. As shown in FIGS. 10B, 10C, 10D, and 10E, metal silicide regions 64 and metal silicon nitride layer 68 wrap around the respective source/drain regions 44, while contact plugs 74 are in contact with the top surfaces of some portions, but not all, of the corresponding metal silicon nitride layer 68.

In the embodiments shown in FIGS. 1 through 10E, metal silicide regions 64 and metal silicon nitride layer 68 are formed before the formation of CESL 70 and ILD 72. CESL 46 and ILD 48 (FIG. 5), on the other hand, are sacrificial features that are removed from the final structure. In accordance with alternative embodiments, metal silicide regions 64 and metal silicon nitride layer 68 may be formed after the formation of CESL 46 and ILD 48, which are left in the final structure. FIGS. 11 through 16 illustrate the perspective views and cross-sectional views of intermediate stages in the formation of a transistor in accordance with these embodiments of the present disclosure. Unless specified otherwise, the materials and the formation methods of the components in these embodiments are essentially the same as the like components, which are denoted by like reference numerals in the embodiments shown in FIGS. 1 through 10E. The details regarding the formation process and the materials of the components shown in FIGS. 11 through 16 may thus be found in the discussion of the embodiment shown in FIGS. 1 through 10E.

Figure 11:
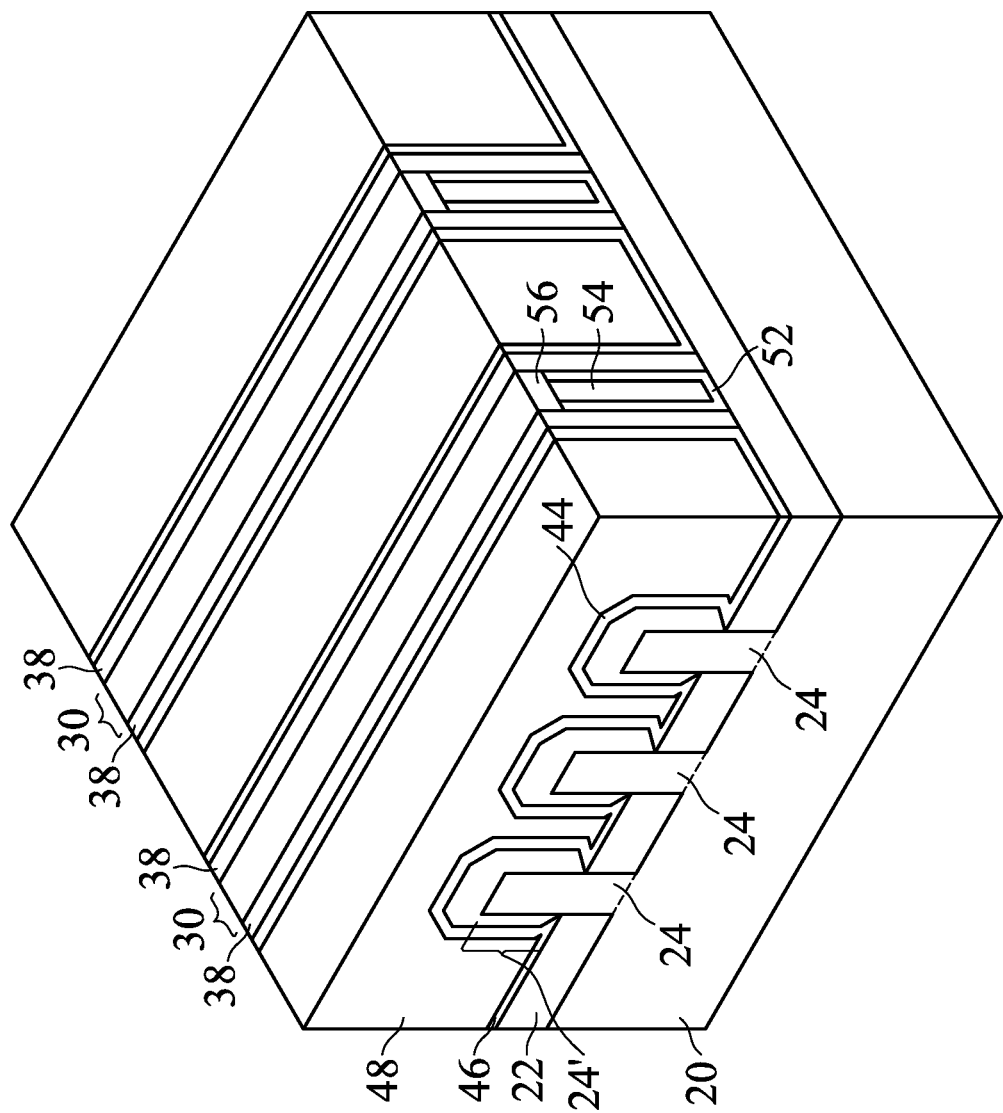
FIGS. 11 through 17 are perspective views and cross-sectional views of intermediate stages in the formation of a transistor and contact structures in accordance with some embodiments.

The initial steps of these embodiments are essentially the same as shown in FIGS. 1 through 5. FIG. 11 illustrates a resulting structure (the same structure as in FIG. 5) as an example, wherein CESL 46 and ILD 48 are formed to cover source/drain regions 44. It is appreciated that the source/drain regions 44 may have various structures such as what are shown in FIGS. 6C, 6D, and 6E. Next, referring to FIG. 12, contact openings 78 are formed by etching ILD 48 and CESL 46. Source/drain regions 44 are thus exposed.

In accordance with alternative embodiments of the present disclosure, instead of growing source/drain regions 44 to a level higher than the top surface of protruding fins 24', a recess is performed to etch protruding fins 24'. Lines 27 schematically illustrate the top surfaces of the recessed fins 24'. An implantation is performed on the recessed fins 24' to form recessed source/drain regions 44. In accordance with these embodiments, the epitaxy semiconductor regions 42 are not formed.

FIGS. 13 through 17 illustrate the cross-sectional views of intermediate stages in the selective deposition, selective etching, and selective nitridation in accordance with some embodiments. In accordance with some embodiments of the present disclosure, the process steps shown in FIGS. 13 through 15 (and possibly FIG. 16) are in-situ performed in the same vacuum environment such as the vacuum chamber 60 as shown in FIG. 18, and there is no vacuum break throughout the entire period for performing these process steps. It is noted that FIGS. 13 through 17 illustrate the cross-sectional views in a vertical plane same as the vertical plane containing line A'-A' in FIG. 12. The cross-sectional views in the vertical plane B'-B' (FIG. 12) will be similar to the structures shown in the figures identified with numbers 7C/7D/7E, 8C/8D/8E, and 9C/9D/9E, and hence are not repeated.

Figure 12:
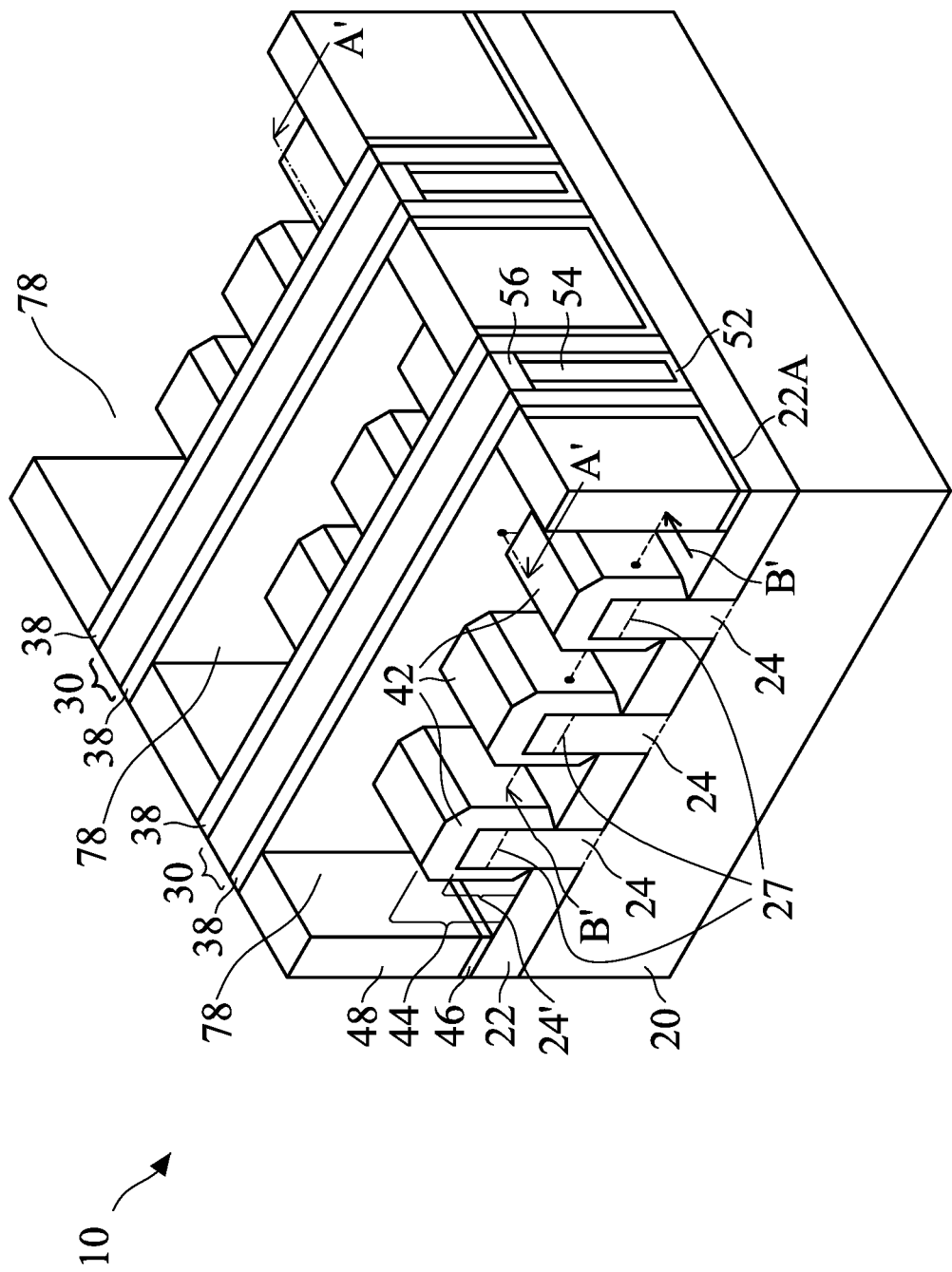
Figure 13:
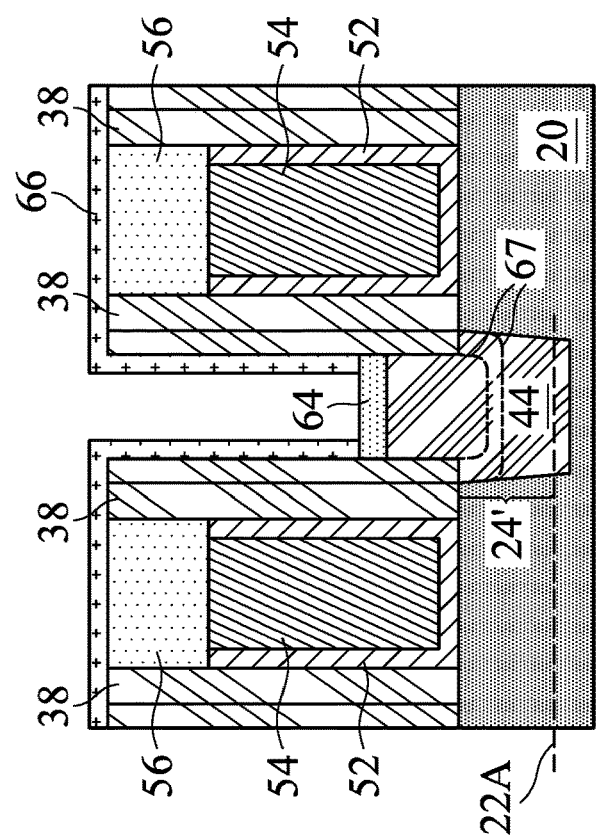

Referring to FIG. 13, an in-situ selective deposition is performed to simultaneously form metal silicide layer (which may be a titanium silicide layer) 64 on the exposed surfaces of source/drain regions 44. In accordance with some embodiments, as shown in FIGS. 12 and 13, the epitaxy of semiconductor regions 42 results in the top surface of metal silicide layer 64 to be higher than the top surface of protruding fin 24'.

In accordance with the embodiments in which epitaxy semiconductor regions 42 (FIG. 12) are not formed, and protruding fins 24' are recessed to levels 27 (FIG. 12), the shape of metal silicide layer 64 will be similar to the regions illustrated with dashed lines 67, and metal layer 66 will further extend down to the bottom end of gate spacers 38.

Figure 14:
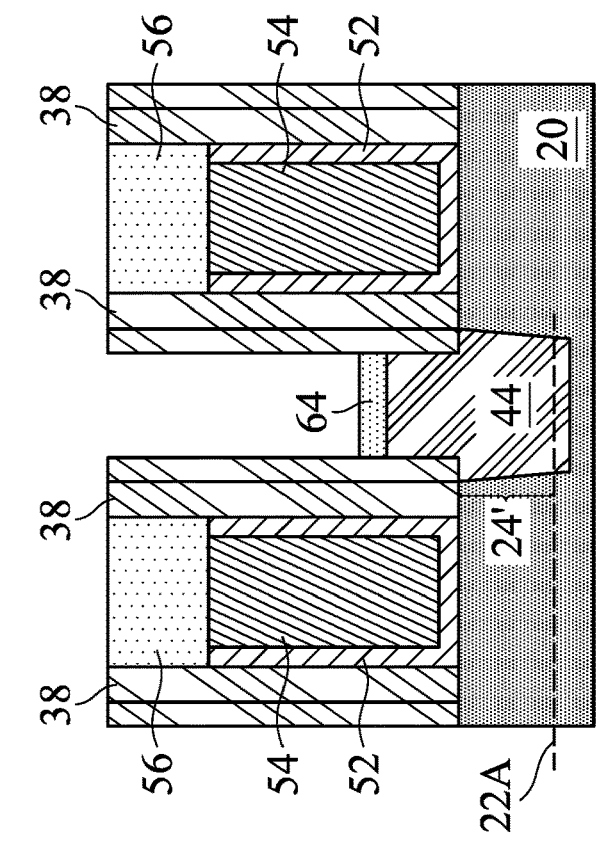
Figure 15:
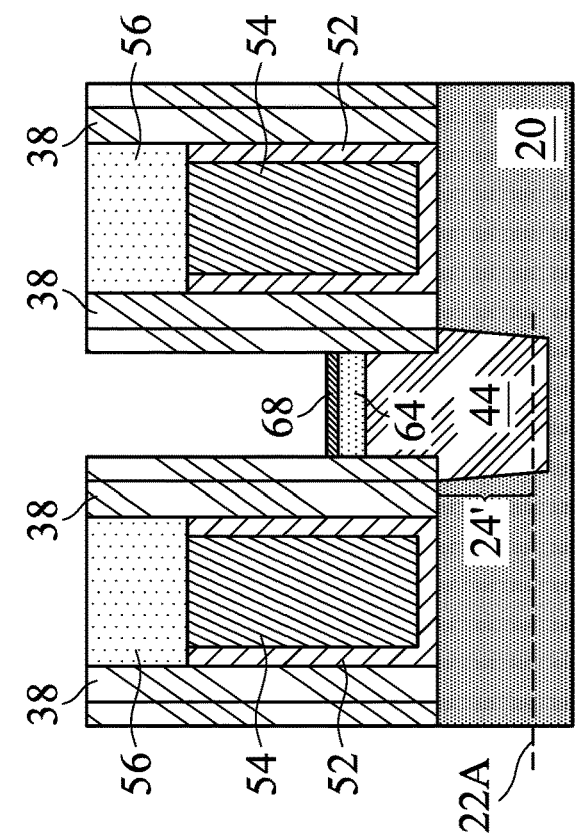

Next, the in-situ selective etching is performed, and hence metal layer 66 is etched. Metal silicide layer 64 is left. The resulting structure is shown in FIG. 14. FIG. 15 illustrates the in-situ selective nitridation to form metal silicon nitride layer 68. In accordance with some embodiments of the present disclosure, an anneal is performed to change the phase of the metal silicide so that the resistance of the resulting metal silicide layer 64 is reduced. The anneal may also be in-situ performed in the same vacuum chamber for the selective deposition, the selective etching, and the selective nitridation.

Figure 16:
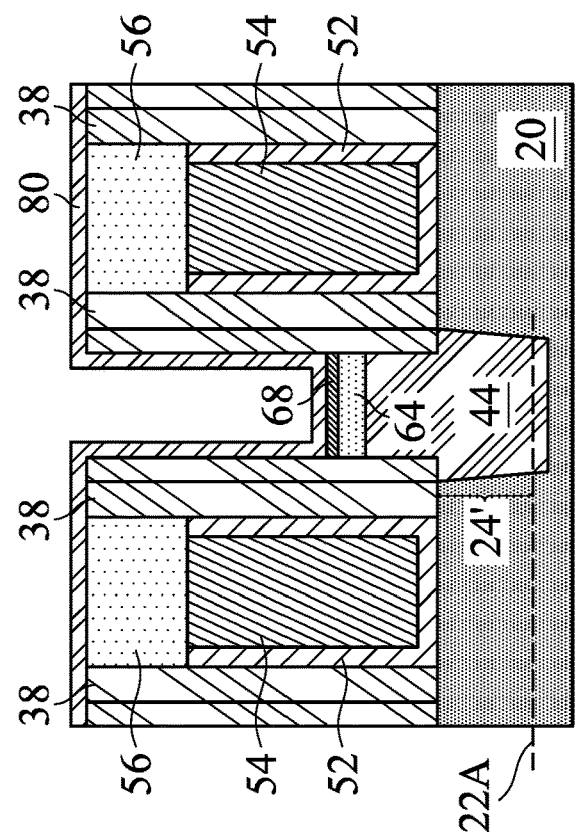

After the anneal, a metal nitride layer 80, which may be a titanium nitride layer, is deposited, as shown in FIG. 16. In accordance with some embodiments of the present disclosure, the deposition is in-situ performed in the same process chamber (with no vacuum break therebetween) as the selective deposition, the selective etching, the selective nitridation, and the anneal. In accordance with other embodiments of the present disclosure, the deposition of metal nitride layer 80 is performed after a vacuum break and in a different process chamber. Metal nitride layer 80 is conformal, and extends into the gap between neighboring gate stacks. The bottom surface of metal nitride layer 80 contacts metal silicon nitride layer 68.

Figure 17:
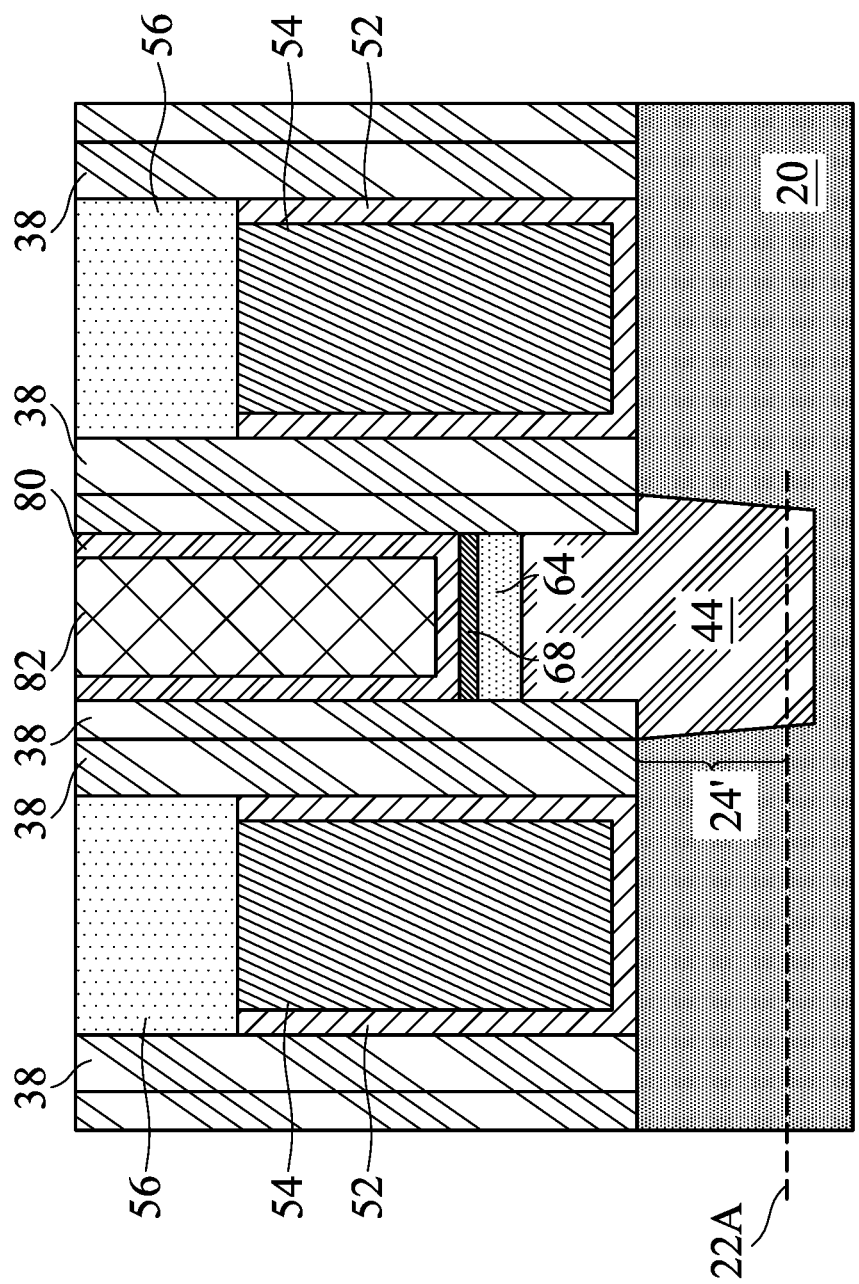

FIG. 17 illustrates the filling of the remaining gap with a filling metal 82, and a planarization step for removing excess portions of the filling metal 82 and metal nitride layer 80. The filling metal 82 and metal nitride layer 80 are in combination referred to as a contact plug, which have a similar shape as shown in 10A, 10B, 10C, 10D, and 10E.

The embodiments of the present disclosure have some advantageous features. In conventional silicide formation processes, a metal layer is deposited first, followed by an anneal process to form silicide, wherein some portions of the metal layer react with the source/drain regions to form silicide. The unreacted portions of the metal layer are then removed, which may involve wet etching using peroxide. This causes some portions of the metal silicide to be oxidized, and the resulting oxide needs to be removed before forming a metal nitride layer. The removal of the oxide, however, results in the loss of metal silicide, particularly because the metal silicide is typically metal-rich, and hence the property of the metal silicide is close to the metal. In the embodiments of the present disclosure, however, by using the in-situ performed selective deposition, selective etching, and selective nitridation, no oxidation occurs on the metal silicide, and no oxide-removal is needed. The loss of the metal silicide cause by oxide removal is thus avoided.

In accordance with some embodiments of the present disclosure, a method includes forming a source/drain region, and in a vacuum chamber, preforming a selective deposition to form a metal silicide layer on the source/drain region, and a metal layer on dielectric regions adjacent to the source/drain region. The method further includes selectively etching the metal layer in the vacuum chamber, and selectively forming a metal nitride layer on the metal silicide layer. The selectively forming the metal nitride layer is performed in the vacuum chamber. In an embodiment, the selective deposition and the selectively etching the metal layer are in-situ performed without vacuum break therebetween. In an embodiment, the selectively etching the metal layer and the selectively forming the metal nitride layer are in-situ performed without vacuum break therebetween. In an embodiment, the metal silicide layer and the metal layer are formed simultaneously using same process gases. In an embodiment, the selectively forming the metal nitride layer comprises nitridating a surface layer of the metal silicide layer. In an embodiment, the selective deposition is performed using process gases comprising a metal halide. In an embodiment, the selectively etching is performed using process gases comprising a metal halide. In an embodiment, the selective deposition is performed at an elevated temperature between about 400° C. and about 500° C.

In accordance with some embodiments of the present disclosure, a method includes forming a gate stack over a first portion of a semiconductor fin; epitaxially growing a semiconductor material on a second portion of the semiconductor fin; in a vacuum chamber, simultaneously forming a metal layer and a metal silicide layer, and the metal silicide layer is formed on the semiconductor material; without vacuum break, removing the metal layer; without vacuum break, forming a metal silicon nitride layer on the metal silicide layer; forming a first CESL covering the metal silicon nitride layer; and forming a first inter-layer dielectric over the first CESL. In an embodiment, the method further includes, before the simultaneously forming the metal layer and the metal silicide layer, forming a second CESL and a second inter-layer dielectric covering the semiconductor material; and removing a dummy gate stack over the first portion of the semiconductor fin, wherein the gate stack is formed in a recess left by the dummy gate stack. In an embodiment, the simultaneously forming the metal layer and the metal silicide layer is performed using process gases comprising $TiCl_4$. In an embodiment, the removing the metal layer is performed using additional process gases comprising $TiCl_4$. In an embodiment, the method further includes etching the first CESL and the first inter-layer dielectric to form a contact opening; and filling the contact opening with a contact plug. In an embodiment, the metal layer and the metal silicide layer comprise a titanium layer and a titanium silicide layer, respectively.

In accordance with some embodiments of the present disclosure, a method includes forming a gate stack over a first portion of a semiconductor fin; epitaxially growing a semiconductor material on a second portion of the semiconductor fin; simultaneously forming a metal layer and a metal silicide layer using a first process gas, and the metal silicide layer is formed on the semiconductor material; removing the metal layer using a second process gas, wherein both the first process gas and the second process gas comprise a halide; and forming a metal nitride layer on the metal silicide layer using a third process gas. In an embodiment, each of the first process gas and the second process gas comprises a metal halide. In an embodiment, the first process gas and the second process gas comprise a same metal halide. In an embodiment, the metal layer comprises titanium, and both the first process gas and the second process gas comprise $TiCl_4$. In an embodiment, the forming the metal nitride layer comprises converting a surface layer of the metal silicide layer into a metal silicon nitride layer. In an embodiment, the simultaneously forming the metal layer and the metal silicide layer, the removing the metal layer, and the forming the metal nitride layer are performed in a same process chamber.

In accordance with some embodiments of the present disclosure, a method includes forming a dummy gate stack over a first portion of a semiconductor fin; forming a gate spacer on a sidewall of the dummy gate stack; epitaxially growing a semiconductor material on a second portion of the semiconductor fin; forming a first inter-layer dielectric to cover the semiconductor material; replacing the dummy gate stack with a replacement gate stack; removing the first inter-layer dielectric to re-expose the semiconductor material; in a vacuum chamber, cleaning the semiconductor material; in the vacuum chamber, selectively forming a metal silicide layer on the semiconductor material; and forming a metal silicon nitride layer over the metal silicide layer, and at a time the forming the metal silicon nitride layer is finished, a metal of the metal silicide layer does not extend on the gate spacer. In an embodiment, at a same time the metal silicide layer is formed, a metal layer is formed on the gate spacer. In an embodiment, the method further includes selectively etching the metal layer in the vacuum chamber.

In accordance with some embodiments of the present disclosure, a method includes forming a dummy gate stack over a first portion of a semiconductor fin; forming a gate spacer on a sidewall of the dummy gate stack; epitaxially growing a semiconductor material on a second portion of the semiconductor fin; forming a first inter-layer dielectric to cover the semiconductor material; replacing the dummy gate stack with a replacement gate stack; removing the first inter-layer dielectric to re-expose the semiconductor material; in a vacuum chamber, selectively forming a metal silicide layer on the semiconductor material; and in the vacuum chamber, forming a metal silicon nitride layer over the metal silicide layer, wherein no vacuum break occurs between the selectively forming the metal silicide layer and the forming the metal silicon nitride layer. In an embodiment, the selectively forming the metal silicide layer and the forming the metal silicon nitride layer are performed using a same halide as process gases. In an embodiment, the selectively forming the metal silicide layer and the forming the metal silicon nitride layer are performed using $TiCl_4$ as process gases.

In accordance with some embodiments of the present disclosure, a method includes epitaxially growing a semiconductor material on a portion of a semiconductor fin; forming an inter-layer dielectric to cover the semiconductor material; removing the inter-layer dielectric to re-expose the semiconductor material; in a vacuum chamber, selectively forming a metal silicide layer on the semiconductor material; and in the vacuum chamber, nitridating a surface layer of the metal silicide layer to form a metal silicon nitride layer. In an embodiment, the method further includes, between the forming the inter-layer dielectric and the removing the inter-layer dielectric, replacing a dummy gate stack on the portion of the semiconductor fin with a replacement gate stack. In an embodiment, no vacuum break occurs between the selectively forming the metal silicide layer and the nitridating the surface layer of the metal silicide layer. In an embodiment, when the metal silicide layer is formed, a metal layer is formed on dielectric material adjacent to the semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming isolation regions extending into a semiconductor substrate;
   forming a first gate stack on a semiconductor fin, wherein the semiconductor fin protrudes higher than the isolation regions;
   forming a first gate spacer on a sidewall of the first gate stack;
   forming a source/drain region on a side of the first gate stack, wherein the forming the source/drain region comprises growing a semiconductor layer on the semiconductor fin, wherein the semiconductor layer has a bottom end in physical contact with a top surface of the isolation regions;
   forming a first inter-layer dielectric to cover the source/drain region;
   removing at least a portion of the first inter-layer dielectric to form a trench, with the source/drain region exposed through the trench; and
   forming a metal silicide layer, wherein the metal silicide layer contacts opposing sidewalls of the source/drain region, and the metal silicide layer comprises a metal silicide, and the metal silicide is in physical contact with the top surface of the isolation regions.

2. The method of claim 1, wherein the opposing sidewalls of the source/drain region are parallel to each other, and are substantially perpendicular to a major bottom surface of the semiconductor substrate, and wherein the metal silicide layer further contacts a top surface of the source/drain region.

3. The method of claim 1, wherein the opposing sidewalls of the source/drain region comprise up-facing facets and down-facing facets.

4. The method of claim 1, wherein the metal silicide layer contacts the first gate spacer.

5. The method of claim 1 further comprising:
   in a vacuum chamber, cleaning the source/drain region, wherein the metal silicide layer is selectively formed on the source/drain region in the vacuum chamber;
   forming a second inter-layer dielectric in the trench; and
   forming a contact plug extending into the second inter-layer dielectric to electrically connect to the metal silicide layer.

6. The method of claim 1, wherein the source/drain region is between the first gate stack and a second gate stack, and the method further comprises:
   forming a second gate spacer on a sidewall of the second gate stack, wherein after the first inter-layer dielectric is removed, both of the first gate spacer and the second gate spacer are exposed to the trench.

7. The method of claim 1 further comprising:
   depositing a metal layer on the first gate spacer, wherein the metal silicide layer and the metal layer are formed simultaneously; and
   selectively etching the metal layer, wherein the depositing the metal layer and the selectively etching the metal layer are in-situ performed in a same vacuum environment.

8. The method of claim 7 further comprising:
   after the metal layer is selectively etched, forming a metal silicon nitride layer over the metal silicide layer.

9. The method of claim 8, wherein the metal silicon nitride layer is in the trench, and the method further comprises forming a contact plug contacting a top portion of the metal silicon nitride layer.

10. A method comprising:
    forming a first gate stack and a second gate stack over a semiconductor fin, wherein the first gate stack and the second gate stack extend over isolation regions;
    forming a first gate spacer and a second gate spacer on sidewalls of the first gate stack and the second gate stack, respectively;
    epitaxially growing a semiconductor material between the first gate spacer and the second gate spacer, wherein the semiconductor material is grown on a top surface and sidewalls of the semiconductor fin, and the semiconductor material comprises a bottom in contact with top surfaces of the isolation regions;
    forming a first inter-layer dielectric to cover the semiconductor material;
    removing the first inter-layer dielectric to form a trench between the first gate spacer and the second gate spacer, wherein the trench extends from the first gate spacer to the second gate spacer; and
    forming a metal silicide layer on the semiconductor material, wherein the metal silicide layer is formed on all exposed surfaces of the semiconductor material, and the metal silicide layer comprises a metal silicide in physical contact with underlying shallow trench isolation regions.

11. The method of claim 10, wherein in a cross-sectional view of the metal silicide layer, the metal silicide layer has a diamond shape.

12. The method of claim 10 further comprising:
    forming a contact etch stop layer to extend into the trench, wherein the contact etch stop layer covers the metal silicide layer;
    forming a second inter-layer dielectric on the contact etch stop layer, wherein the second inter-layer dielectric extends into the trench; and forming a contact plug extending into the second inter-layer dielectric.

13. The method of claim 10, wherein the metal silicide layer is selectively formed on the semiconductor material in a vacuum chamber, and wherein in the selectively forming the metal silicide layer, a metal layer is simultaneously formed on the first gate spacer and the second gate spacer, and the method further comprises:
selectively etching the metal layer; and
in the vacuum chamber, forming a metal silicon nitride layer over the metal silicide layer.

14. The method of claim 13, wherein the selectively etching the metal layer is performed using an etching gas comprising $TiCl_4$, with plasma being turned off.

15. The method of claim 10, wherein the metal silicide layer contacts a top surface and opposing sidewalls of the semiconductor material, and the opposing sidewalls of the semiconductor material are substantially parallel to each other.

16. A method comprising:
forming a gate stack on a semiconductor fin, wherein the gate stack is over and in contact with isolation regions on opposing sides of the semiconductor fin;
forming a gate spacer on a sidewall of the gate stack;
forming a first inter-layer dielectric to cover a source/drain region on a side of the gate spacer, wherein the source/drain region comprises:
a portion of the semiconductor fin; and
a semiconductor material extending on sidewalls of the semiconductor fin, wherein the semiconductor material contacts the isolation regions;
removing the first inter-layer dielectric to form a trench, wherein the source/drain region is re-exposed to the trench;
forming a metal silicide layer on the source/drain region, wherein the metal silicide layer covers all exposed top surface and sidewall surfaces of the source/drain region that are exposed to the trench, and wherein a metal silicide of the metal silicide layer is in physical contact with the isolation regions; and
forming a metal silicon nitride layer on the metal silicide layer.

17. The method of claim 16 further comprising:
forming a contact etch stop layer to contact the metal silicon nitride layer; and
forming a second inter-layer dielectric on the contact etch stop layer, wherein both of the contact etch stop layer and the second inter-layer dielectric extend into the trench.

18. The method of claim 17 further comprising forming a contact plug extending into the contact etch stop layer and the second inter-layer dielectric, wherein the contact plug contacts a top portion of the metal silicon nitride layer, and the contact etch stop layer contacts a bottom portion of the metal silicon nitride layer.

19. The method of claim 17, wherein the contact etch stop layer comprises a portion directly underlying the source/drain region.

20. The method of claim 16, wherein the metal silicide layer comprises a portion directly underlying the source/drain region.

* * * * *